United States Patent
Huang

(10) Patent No.: US 12,002,814 B2
(45) Date of Patent: Jun. 4, 2024

(54) ARRAY SUBSTRATE AND MANUFACTURING METHOD THEREOF

(71) Applicant: TCL CHINA STAR OPTOELECTRONICS TECHNOLOGY CO., LTD., Shenzhen (CN)

(72) Inventor: Xu Huang, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 812 days.

(21) Appl. No.: 17/057,629

(22) PCT Filed: Oct. 20, 2020

(86) PCT No.: PCT/CN2020/122229
§ 371 (c)(1),
(2) Date: Nov. 20, 2020

(87) PCT Pub. No.: WO2022/047908
PCT Pub. Date: Mar. 10, 2022

(65) Prior Publication Data
US 2022/0310665 A1 Sep. 29, 2022

(30) Foreign Application Priority Data

Sep. 4, 2020 (CN) .......................... 202010919303.9

(51) Int. Cl.
*H01L 27/12* (2006.01)
*H10K 59/12* (2023.01)

(52) U.S. Cl.
CPC ........ *H01L 27/1222* (2013.01); *H01L 27/127* (2013.01); *H10K 59/12* (2023.02)

(58) Field of Classification Search
None
See application file for complete search history.

(56) References Cited

U.S. PATENT DOCUMENTS

| | | |
|---|---|---|
| 2006/0214233 A1 | 9/2006 | Ananthanarayanan et al. |
| 2007/0012995 A1 | 1/2007 | Park et al. |

FOREIGN PATENT DOCUMENTS

| | | |
|---|---|---|
| CN | 1503368 A | 6/2004 |
| CN | 1806319 A | 7/2006 |
| | (Continued) | |

OTHER PUBLICATIONS

International Search Report in International application No. PCT/CN2020/122229, dated May 27, 2021.
(Continued)

*Primary Examiner* — Michael Lebentritt
(74) *Attorney, Agent, or Firm* — PV IP PC; Wei Te Chung; Zhigang Ma

(57) ABSTRACT

The present application provides an array substrate and a manufacturing method thereof. The array substrate includes a substrate; an active layer comprising a channel region; a gate insulating layer; a gate corresponding to the channel region of the active layer; and a source and a drain disposed at opposite ends of the active layer, wherein the gate has a groove structure, the groove structure has an opening facing the active layer, and a region of the groove structure corresponding to the active layer is the channel region.

14 Claims, 19 Drawing Sheets

(56) References Cited

FOREIGN PATENT DOCUMENTS

| | | | |
|---|---|---|---|
| CN | 102969280 A | | 3/2013 |
| CN | 103515443 A | | 1/2014 |
| CN | 103594361 A | | 2/2014 |
| CN | 103824780 A | | 5/2014 |
| CN | 104538454 A | | 4/2015 |
| CN | 105097895 A | | 11/2015 |
| CN | 110137084 A | * | 8/2019 |
| CN | 111883531 A | | 11/2020 |
| CN | 109686768 B | * | 4/2021 |
| CN | 113871435 A | * | 12/2021 |
| CN | 115050756 A | * | 9/2022 |
| CN | 109585304 B | * | 4/2023 |
| TW | 201436228 A | | 9/2014 |
| WO | WO-2018201748 A1 | * | 11/2018 |

OTHER PUBLICATIONS

Written Opinion of the International Search Authority in International application No. PCT/CN2020/122229, dated May 27, 2021.
Chinese Office Action issued in corresponding Chinese Patent Application No. 202010919303.9 dated May 28, 2021, pp. 1-8.

\* cited by examiner forming an active layer on a buffer layer, wherein the active layer comprises a channel region, a source contact region, and a drain contact region, and the source contact region and the drain contact region are spaced apart from each other by the channel region; —S10 forming a gate insulating layer above the active layer, wherein the gate insulating layer has a groove structure, and the gate insulating layer covers the opposite side surfaces and the upper surface of the active layer corresponding to the channel region; —S20 forming a metal layer on the gate insulating layer, and patterning the metal layer to form a gate located on the channel region, wherein the gate has a groove structure, and the gate covers the opposite side surfaces and the upper surface of the gate insulating layer; —S30 forming an interlayer insulating layer on the gate, and patterning the interlayer insulating layer to form a via hole located in the source contact region and another via hole located in the drain contact region; —S40 forming a source in contact with the source contact region and a drain in contact with the drain contact region on the interlayer insulating layer, wherein the source covers opposite side surfaces and an upper surface of the drain contact region, and the drain covers opposite side surfaces and an upper surface of the drain contact region; and —S50 sequentially forming a passivation layer and an electrode layer on the second gate, the source, and the drain. —S60

FIG. 6

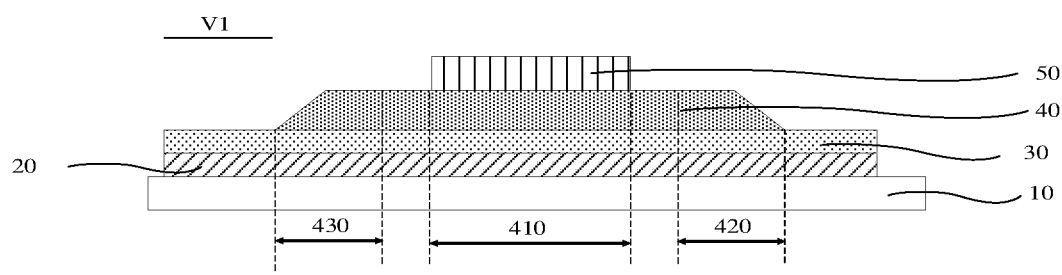
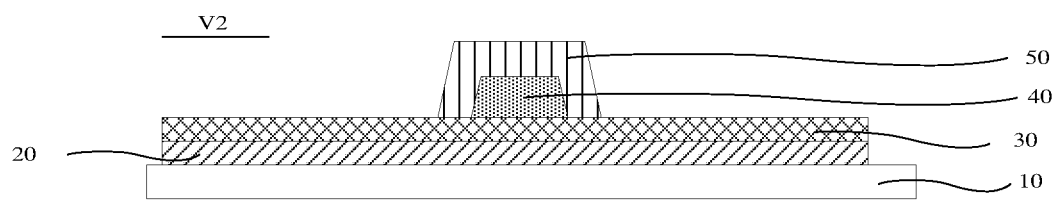
FIG. 7C
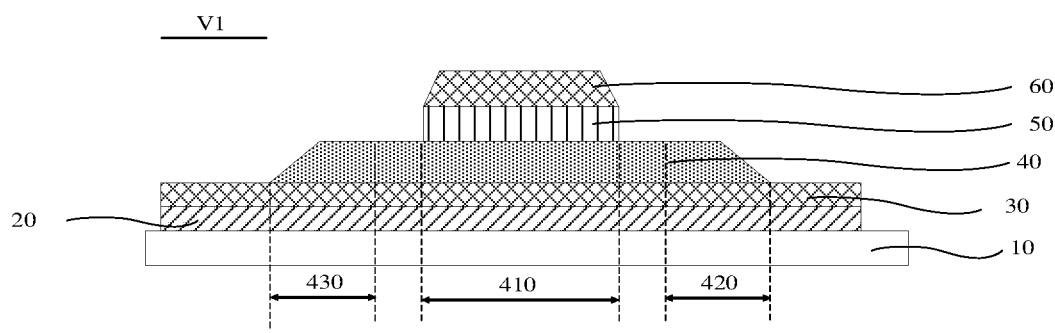
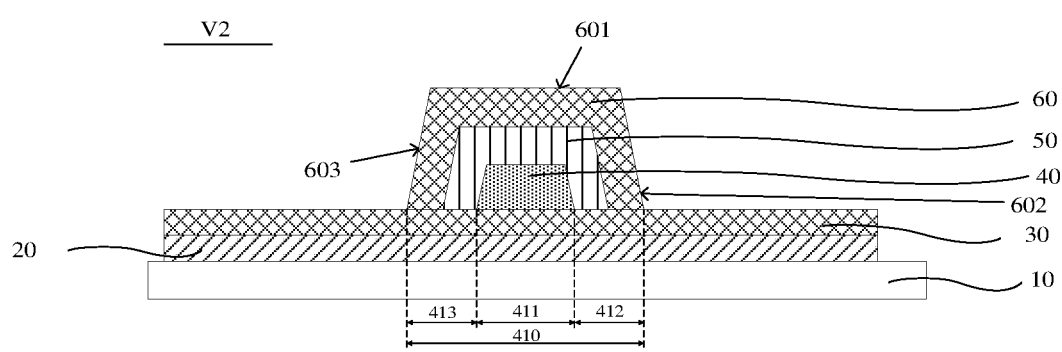
FIG. 7D

V1
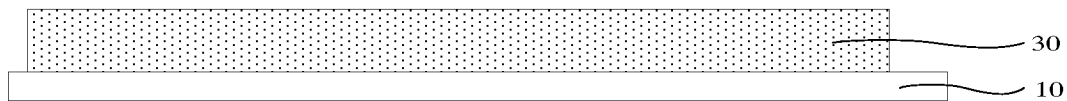
V2
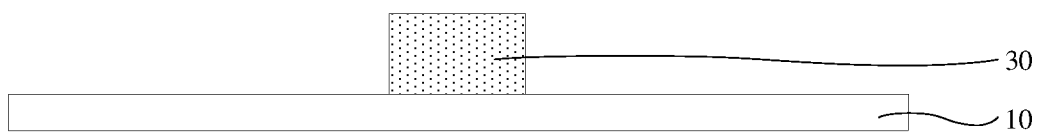
FIG. 16A
V1
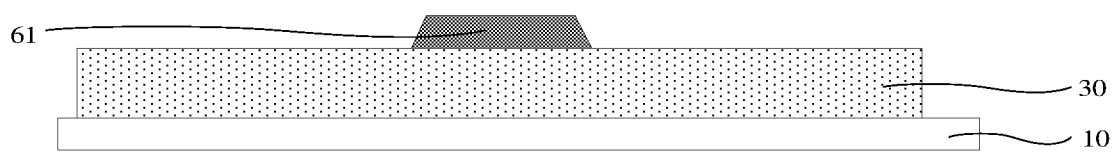
V2
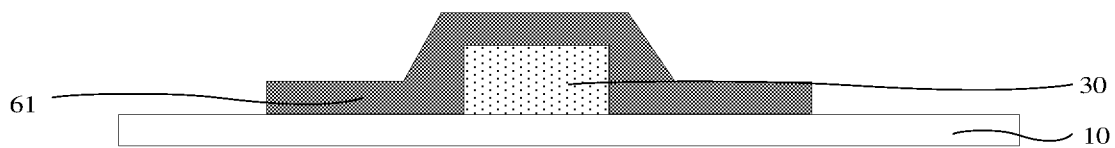
FIG. 16B

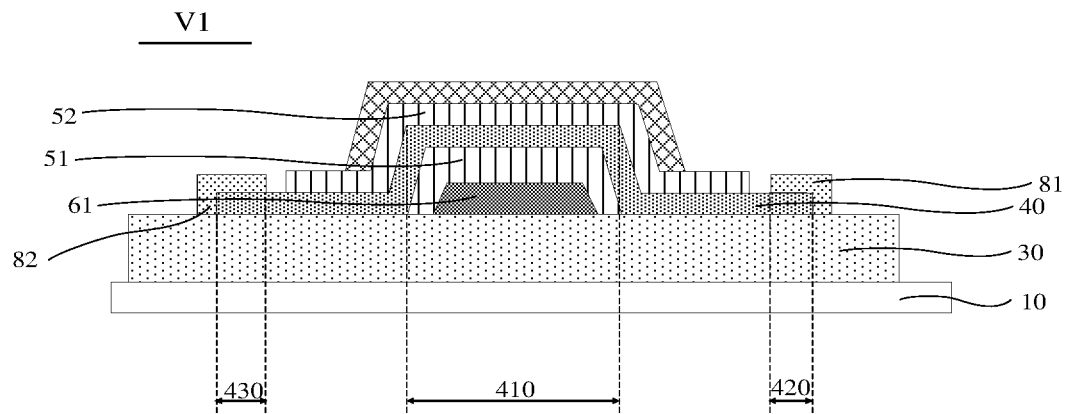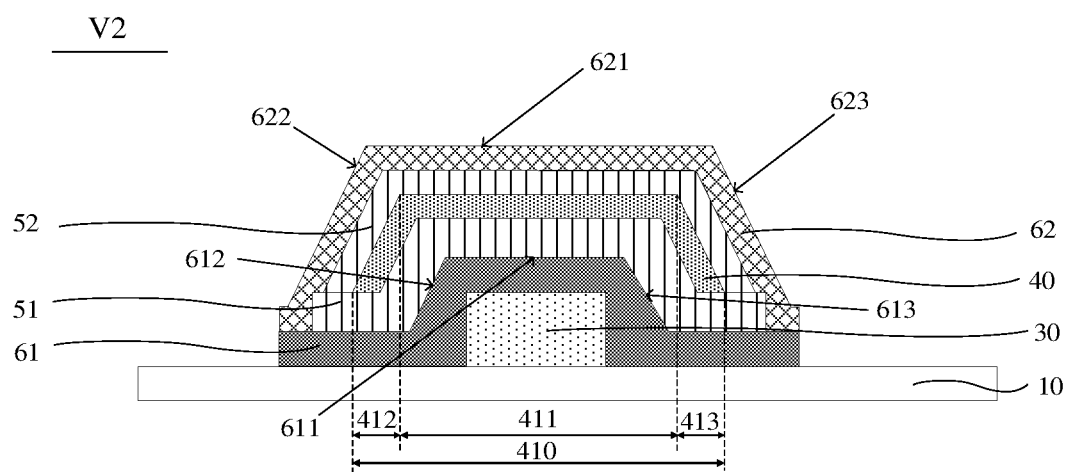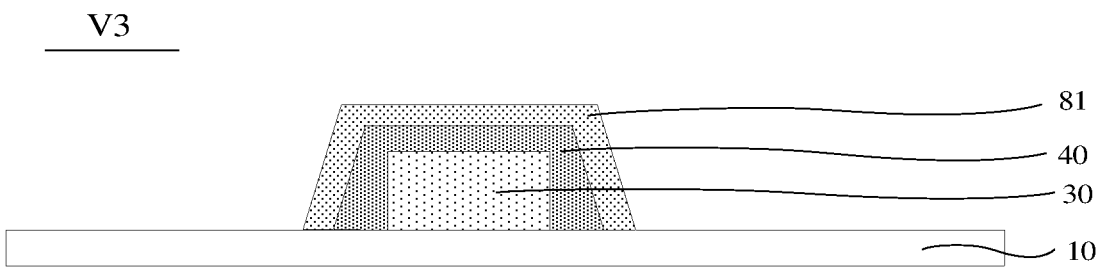
FIG. 16F

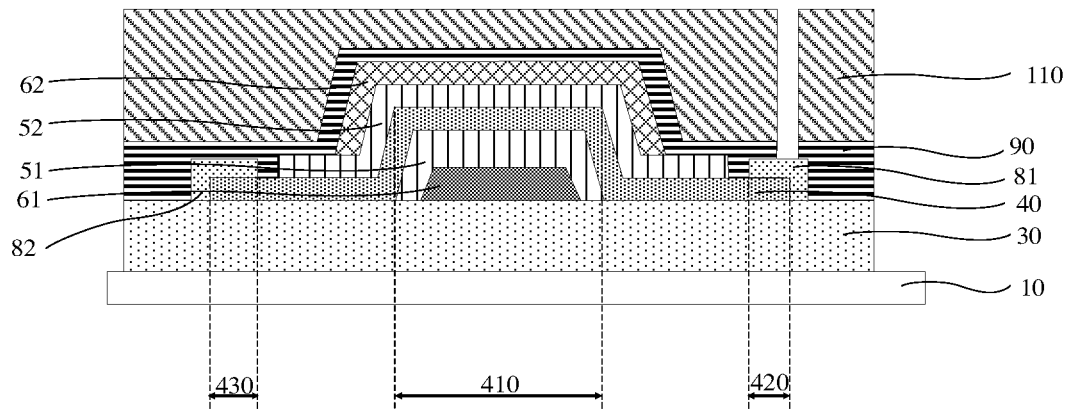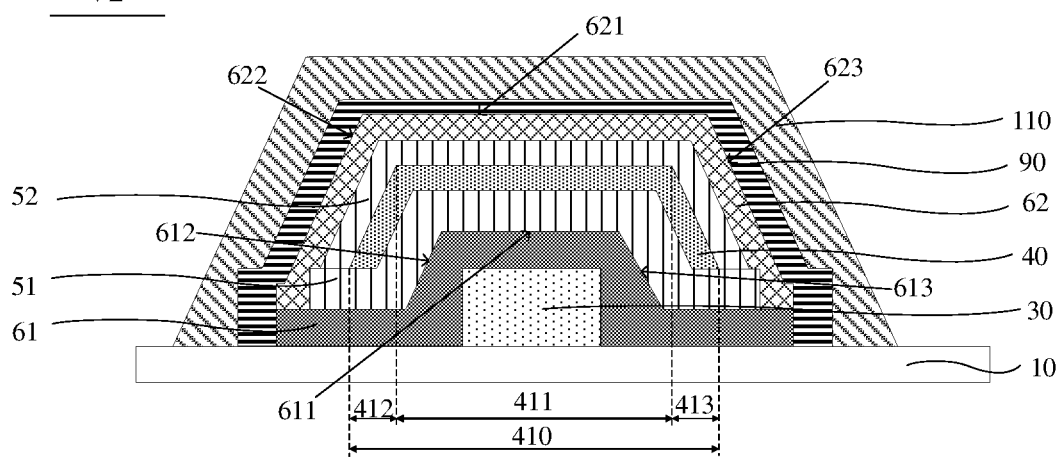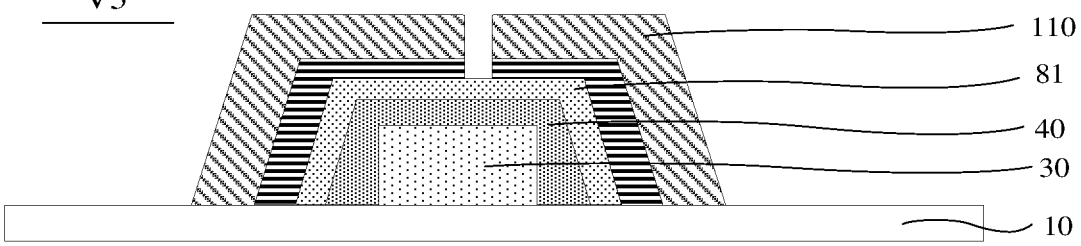
FIG. 16G

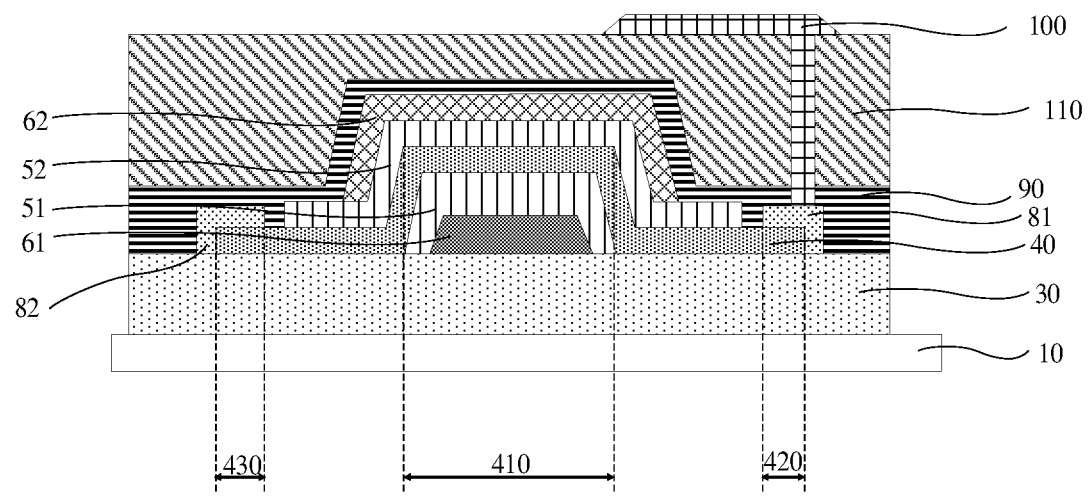
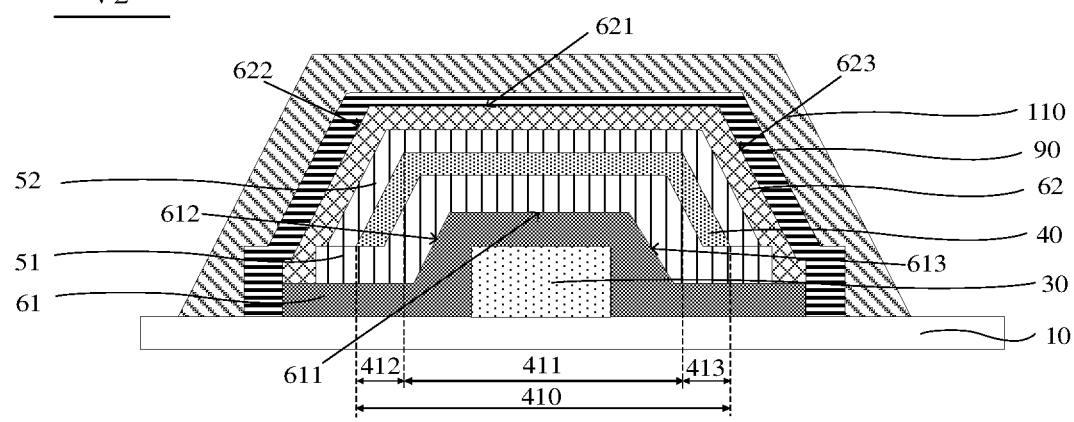
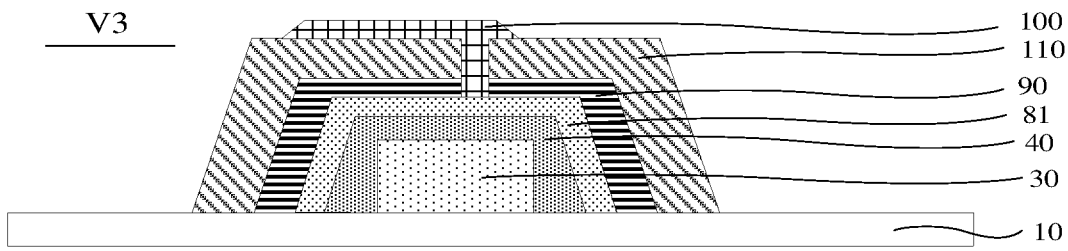
FIG. 16H

ARRAY SUBSTRATE AND MANUFACTURING METHOD THEREOF

BACKGROUND OF INVENTION

Related Applications

This application is a Notional Phase of PCT Patent Application No. PCT/CN2020/122229 having international filing date of Oct. 20, 2020, which claims the benefit of priority of Chinese Patent Application No. 202010919303.9 filed on Sep. 4, 2020. The contents of the above applications are all incorporated by reference as if fully set forth herein in their entirety.

Field of Invention

The present application relates to the field of display technology, in particular to an array substrate and a manufacturing method thereof.

Description of Prior Art

With the development of high pixel per inch (PPI) organic light-emitting diode (OLED) products, requirements for backplanes are gradually increasing, and maintaining performance of small-sized semiconductor components is currently the main goal of the industry. At present, manufacturers are committed to obtaining OLED products with greater saturation current and better saturation characteristics, such that the greater the width/length of the channel region, the better, which means that the channel region having a smaller length and a larger width is conducive to the improvement of performance of the OLED product.

However, the increase in the width of the channel region will directly impact an aperture ratio, which is inconsistent with requirements of small thin film transistor (TFT) devices with high PPI, so the width of the channel region cannot be easily increased to increase a width/length ratio of the channel region. Secondly, under the condition of ensuring high driving current, the manufacturer hopes to design a channel region with an increased width/length ratio, and as the length of the channel region gradually decreases, an off-state leakage current between a source and a drain of the TFT device will become larger and larger (in proportion to the channel width/length ratio), so there is a contradiction in the existing structure design of increasing the drive current while also increasing the leakage current.

SUMMARY OF INVENTION

The present application provides an array substrate and a manufacturing method thereof, which are used to ensure that the driving current is large enough while achieving a high switching current ratio and a high aperture ratio under a design of the same channel length.

In order to solve the above problems, the technical solutions provided by the present application are as follows:

An array substrate, comprising:
a substrate;
an active layer comprising a channel region;
a gate insulating layer;
a gate corresponding to the channel region of the active layer; and
a source and a drain disposed at opposite ends of the active layer,
wherein the gate has a groove structure, the groove structure has an opening facing the active layer, and a region of the groove structure corresponding to the active layer is the channel region.

In the array substrate of the present application, the active layer, the gate insulating layer, and the gate are stacked in sequence; the gate insulating layer has a groove structure covering opposite side surfaces and an upper surface of the active layer corresponding to the channel region; and the gate covers opposite side surfaces and an upper surface of the gate insulating layer.

In the array substrate of the present application, the channel region of the active layer comprises a first channel region defined on the upper surface of the active layer, and a second channel region and a third channel region defined on the opposite side surfaces of the active layer, respectively, and the second channel region, the first channel region, and the third channel region are continuous; and wherein the gate comprises a top portion corresponding to the first channel region, a first side portion corresponding to the second channel region, and a second side portion corresponding to the third channel region, and the top portion, the first side portion, and the second side portion of the gate together constitute the groove structure.

In the array substrate of the present application, the groove structure of the gate extends in a first direction, and a second direction is perpendicular to the first direction; and wherein the gate, the gate insulating layer, and the active layer constitute a three-dimensional channel structure, and a width of the three-dimensional channel structure is a sum of side lengths of cross sections of the top portion, the first side portion, and the second side portion of the gate in the second direction, In the array substrate of the present application, the gate electrode, the gate insulating layer, and the active layer are stacked in sequence; the gate insulating layer has a groove structure, and the gate insulating layer covers opposite side surfaces and a lower surface of the active layer corresponding channel region, and the gate covers opposite side surfaces and a lower surface of the gate insulating layer.

In the array substrate of the present application, the channel region of the active layer comprises a first channel region defined on an upper surface of the active layer, a second channel region and a third channel region defined on opposite side surfaces of the active layer, respectively, and the second channel region, the first channel region, and the third channel region are continuous; and wherein the gate comprises a top portion corresponding to the first channel region, a first side portion corresponding to the second channel region, and a second side portion corresponding to the third channel region, and the top portion, the first side portion, and the second side portion of the gate portion together constitute the groove structure.

In the array substrate of the present application, the groove structure of the gate extends in a first direction, and a second direction is perpendicular to the first direction; and wherein the gate, the gate insulating layer, and the active layer constitute a three-dimensional channel structure, and a width of the three-dimensional channel structure is a sum of side lengths of cross sections of the top portion, the first side portion, and the second side portion of the gate in the second direction, In the array substrate of the present application, the array substrate further comprises a buffer layer, the gate comprises a first gate and a second gate, and the gate insulating layer comprises a first gate insulating layer and a second gate insulating layer;

wherein the substrate, the buffer layer, the first gate, the first gate insulating layer, the active layer, the second gate insulating layer, and the second gate are stacked in sequence; and wherein the buffer layer is disposed corresponding to the channel region of the active layer, the first gate has a groove structure covering opposite side surfaces and an upper surface of the buffer layer, the first gate insulating layer has a groove structure covering opposite side surfaces and an upper surface of the first gate, the active layer has a groove structure covering opposite side surfaces and an upper surface of the first gate insulating layer, the second gate insulating layer has a groove structure covering opposite side surfaces and an upper surface of the active layer, and the second gate covers opposite side surfaces and an upper surface of the second gate insulating layer.

In the array substrate of the present application, the channel region of the active layer comprises a first channel region defined on the upper surface of the active layer, and a second channel region and a third channel region defined on opposite side surfaces of the active layer, respectively, and the second channel region, the first channel region, and the third channel region are continuous;
  wherein the first gate comprises a top portion corresponding to the first channel region, a first side portion corresponding to the second channel region, and a second side portion corresponding to the third channel region, and the top portion, the first side portion, and the second side portion of the first gate together constitute the groove structure; and
  wherein the second gate comprises a top portion corresponding to the first channel region, a third side portion corresponding to the second channel region, and a fourth side portion corresponding to the third channel region, and the top portion, the third side portion, and the fourth side portion of the second gate together constitute the groove structure In the array substrate of the present application, the groove structure of the first gate extends in a first direction, and a second direction is perpendicular to the first direction;
  wherein the buffer layer, the first gate, the first gate insulating layer, the active layer, the second gate insulating layer, and the second gate constitute a three-dimensional channel structure; and
  wherein a width of the three-dimensional channel structure is a sum of side lengths of cross sections of the top portion, the first side portion, and the second side portion of the first gate in the second direction and side lengths of cross sections of the top portion, the third side portion, and the fourth side portion of the second gate in the second direction.

A method of manufacturing an array substrate, comprising the following steps:
  step S10: forming an active layer on a buffer layer, wherein the active layer comprises a channel region, a source contact region, and a drain contact region, and the source contact region and the drain contact region are spaced apart from each other by the channel region;
  step S20: forming a gate insulating layer above the active layer;
  step S30: forming a metal layer on the gate insulating layer, and patterning the metal layer to form a gate located on the channel region;
  step S40: forming an interlayer insulating layer on the gate, and patterning the interlayer insulating layer to form a via hole located in the source contact region and another via hole located in the drain contact region;
  step S50: forming a source in contact with the source contact region and a drain in contact with the drain contact region on the interlayer insulating layer, wherein the source covers opposite side surfaces and an upper surface of the drain contact region, and the drain covers opposite side surfaces and an upper surface of the drain contact region; and
  step S60: sequentially forming a passivation layer and an electrode layer on the source and the drain.

In the method of manufacturing the array substrate of the present application, the gate insulating layer has a groove structure, the gate insulating layer covers opposite side surfaces and an upper surface of the channel region of the active layer; and wherein the gate has a groove structure, and a part of the active layer corresponding to the channel region is insulated from and disposed in the groove structure of the gate.

In the method of manufacturing the array substrate of the present application, the channel region of the active layer comprises a first channel region defined on an upper surface of the active layer, a second channel region and a third channel region defined on opposite side surfaces of the active layer, respectively, and the second channel region, the first channel region, and the third channel region are continuous; and
  wherein the gate comprises a top portion corresponding to the first channel region, a first side portion corresponding to the second channel region, and a second side portion corresponding to the third channel region, and the top portion, the first side portion, and the second side portion of the gate together constitute the groove structure.

In the method of manufacturing the array substrate of the present application, the gate comprises a top portion corresponding to the first channel region, a first side portion corresponding to the second channel region, and a second side portion corresponding to the third channel region, and the top portion, the first side portion, and the second side portion of the gate together constitute the groove structure.

In the method of manufacturing the array substrate of the present application, the groove structure of the gate extends in a first direction, and a second direction is perpendicular to the first direction; and wherein the gate, the gate insulating layer, and the active layer constitute a three-dimensional channel structure, and a width of the three-dimensional channel structure is a sum of side lengths of cross sections of the top portion, the first side portion, and the second side portion of the gate in the second direction.

A method of manufacturing an array substrate, comprising the following steps:
  step S10: forming a first metal layer on a buffer layer, and patterning the first metal layer to form a first gate;
  step S20: forming a first gate insulating layer on the first gate;
  step S30: forming an active layer on the first gate insulating layer, wherein the active layer comprises a channel region, a source contact region, and a drain contact region, and the source contact region and the drain contact region are spaced apart from each other by the channel region;
  step S40: forming a second gate insulating layer on the active layer;
  step S50: forming a second metal layer on the second gate insulating layer, and patterning the second metal layer to form a second gate corresponding to the channel region, a source in contact with the source contact region, and a drain in contact with the drain contact region;

step S60: sequentially forming a passivation layer and a planarization layer on the second gate, the source, and the drain; and step S70: forming an electrode layer on the planarization layer.

In the method of manufacturing the array substrate of the present application, the buffer layer is disposed corresponding to the channel region of the active layer, the first gate has a groove structure covering opposite side surfaces and an upper surface of the buffer layer, the first gate insulating layer has a groove structure covering opposite side surfaces and an upper surface of the first gate, the active layer has a groove structure covering opposite side surfaces and an upper surface of the first gate insulating layer, the second gate insulating layer has a groove structure covering opposite side surfaces and an upper surface of the active layer, and the second gate covers opposite side surfaces and an upper surface of the second gate insulating layer.

In the method of manufacturing the array substrate of the present application, the channel region of the active layer comprises a first channel region defined on the upper surface of the active layer, and a second channel region and a third channel region defined on opposite side surfaces of the active layer, respectively, and the second channel region, the first channel region, and the third channel region are continuous;

wherein the first gate comprises a top portion corresponding to the first channel region, a first side portion corresponding to the second channel region, and a second side portion corresponding to the third channel region, and the top portion, the first side portion, and the second side portion of the first gate together constitute the groove structure; and wherein the second gate comprises a top portion corresponding to the first channel region, a third side portion corresponding to the second channel region, and a fourth side portion corresponding to the third channel region, and the top portion, the third side portion, and the fourth side portion of the second gate together constitute the groove structure.

In the method of manufacturing the array substrate of the present application, the groove structure of the first gate is a first direction, and a second direction is perpendicular to the first direction;

wherein the buffer layer, the first gate, the first gate insulating layer, the active layer, the second gate insulating layer, and the second gate constitute a three-dimensional channel structure; and wherein a width of the three-dimensional channel structure is a sum of side lengths of cross sections of the top portion, the first side portion, and the second side portion of the first gate in the second direction and side lengths of cross sections of the top portion, the third side portion, and the fourth side portion of the second gate in the second direction.

In the method of manufacturing the array substrate of the present application, a cross section of the three-dimensional channel structure perpendicular to an extending direction of the groove structure of the first gate has a trapezoid shape, a square shape, and/or a fin shape.

In the present application, the channel region corresponding to the gate, the gate insulating layer, and the active layer is formed into a three-dimensional channel structure, and the width of the channel region is increased in disguised form, such that a large enough driving current is ensured while achieving a high switching current ratio and a high aperture ratio under a design of the same channel length, thereby solving the problem of excessive leakage current caused by reducing the channel width/length ratio and the process problem of small channels.

BRIEF DESCRIPTION OF DRAWINGS

The following describes the specific implementations of the present application in detail with reference to the accompanying drawings, which will make the technical solutions and other beneficial effects of the present application obvious.

FIG. 6 is a flow chart of steps of a method of manufacturing an array substrate provided in Embodiment 1 of the present application.

FIG. 7A to FIG. 7G are schematic structural diagrams of a array substrate during a manufacturing process thereof provided in Embodiment 1 of the present application.

FIG. 16A to FIG. 16H are schematic structural diagrams of the array substrate provided in Embodiment 3 of the present application during the manufacturing process.

DETAILED DESCRIPTION OF PREFERRED EMBODIMENTS

The present application provides an array substrate and a manufacturing method thereof. In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 1:
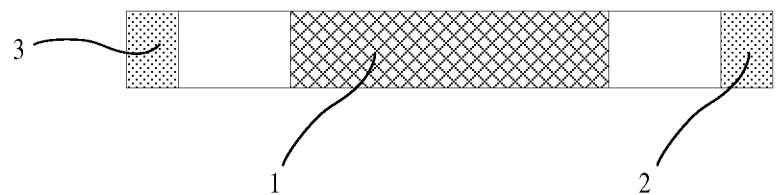
FIG. 1 is a top view of a conventional array substrate along a channel region.

Referring to FIG. 1, FIG. 1 is a top view of a conventional array substrate along the channel region.

In the prior art, in order to obtain OLED products with greater saturation current and better saturation characteristics, the smaller the width/length of the channel region 1, the better. However, the increase in the width of the channel region 1 will directly impacts the aperture ratio, which is inconsistent with requirements of small thin film transistor (TFT) devices with high PPI. In addition, under the condition of ensuring high driving current, a channel region 1 is designed to have an increased width/length ratio, and as the length of the channel region 1 gradually decreases, an off-state leakage current between a source 2 and a drain 3 of the TFT device will become larger and larger, so there is a contradiction in the existing structure design of increasing the drive current while also increasing the leakage current. In view of this, the present application provides an array substrate that can solve the above-mentioned defects.

Figure 2:
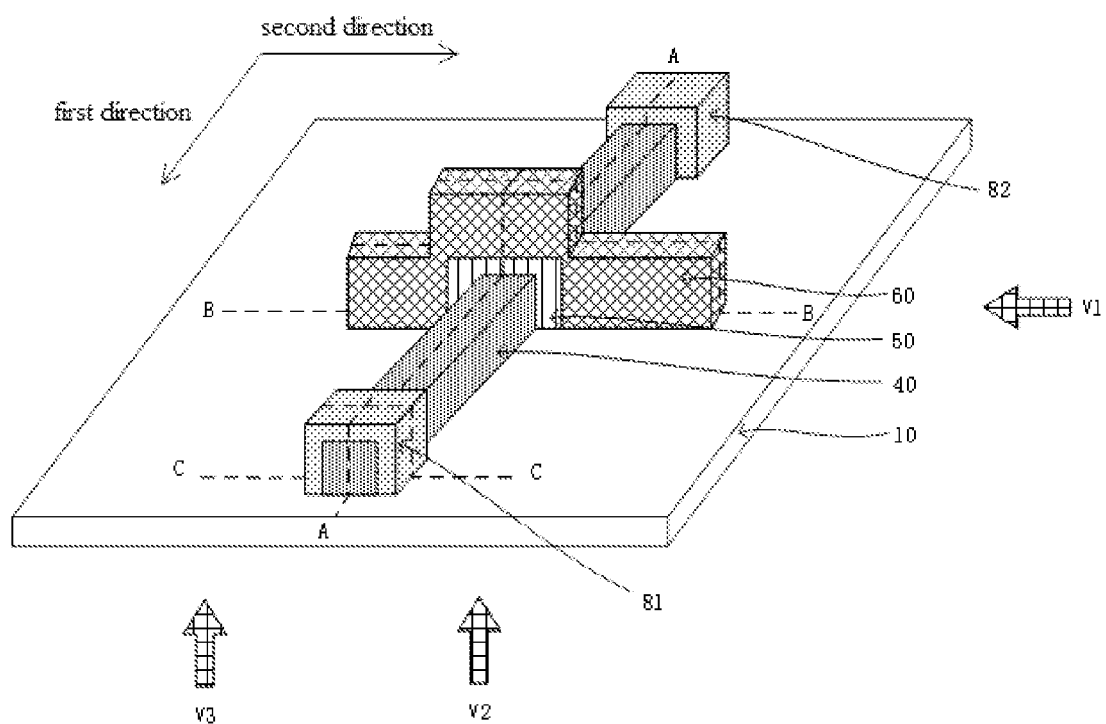
FIG. 2 is a three-dimensional view of an array substrate provided by the present application.

Referring to FIG. 2, FIG. 2 is a three-dimensional view of the array substrate provided by the present application.

In the present application, the array substrate includes a substrate 10; an active layer 40 comprising a channel region; a gate insulating layer disposed on the active layer 40; a gate 60 corresponding to the channel region of the active layer 40; and a source 81 and a drain 82 disposed at opposite ends of the active layer 40.

The gate 60 has a groove structure, and the groove structure has an opening facing the active layer 40, and a region of the groove structure corresponding to the active layer 40 is the channel region.

Further, in the present application, the array substrate is a top-gate array substrate, the active layer 40, the gate insulating layer 50, and the gate 60 are stacked in sequence, and a part of the active layer 40 corresponding to the channel region is insulated from and disposed in the groove structure of the gate 60.

It should be noted that the present application does not limit the structure of the array substrate as a top-gate array substrate, a bottom-gate array substrate or a double-gate array substrate. The array substrate being a top-gate array substrate is only used as an example for demonstration In the present application, the gate 60, the gate insulating layer 50, and the channel region corresponding to the active layer 40 form a three-dimensional channel structure, and a width of the channel region is increased in disguised form, such that a large enough driving current is ensured while achieving a high switching current ratio and a high aperture ratio under a design of the same channel length, thereby solving the problem of excessive leakage current caused by reducing the channel width/length ratio and the process problem of small channels.

The technical solution of the present application will now be described in conjunction with specific embodiments.

Embodiment 1

Figure 3:
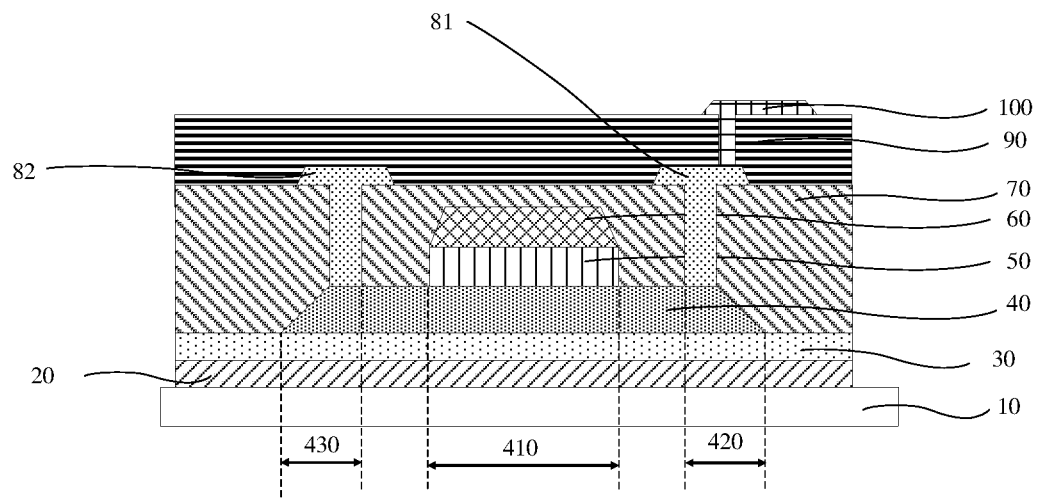
FIG. 3 is a cross-sectional view of an array substrate provided by Embodiment 1 of the present application.

Referring to FIG. 3, FIG. 3 is a cross-sectional view of an array substrate provided by Embodiment 1 of the present application.

In this embodiment, the array substrate is a top-gate array substrate.

In this embodiment, the array substrate includes a substrate 10, a light-shielding layer 20 disposed above the substrate 10, a buffer layer 30 disposed above the light-shielding layer 20, an active layer 40 disposed above the buffer layer 30, a gate insulating layer 50 disposed above the active layer 40, a gate 60 disposed above the gate insulating layer 50, an interlayer dielectric layer 70 disposed above the gate 60, a source 81 and a drain 82 disposed above the interlayer dielectric layer 70, a passivation layer 90 disposed above the source 81 and the drain 82, and an electrode layer 100 disposed above the passivation layer 90.

In this embodiment, the substrate 10 is a PI substrate, mainly made of polyimide, which can effectively improve the light transmittance.

In this embodiment, a material of the light-shielding layer 20 includes but is not limited to a metal or a metal laminate such as molybdenum, molybdenum-titanium alloy, silver, aluminum, etc., and may also be a non-metal light-shielding material.

In this embodiment, the active layer 40 includes a channel region 410, a source contact region 420 in contact with the source 81, and a drain contact region 430 in contact with the drain 82. The source contact region 420 and the drain contact region 430 are spaced apart from each other by the channel region 410.

A material of the active layer 40 includes, but is not limited to, indium gallium zinc oxide, indium tin oxide, indium zinc oxide, and/or aluminum zinc oxide.

Figure 4:
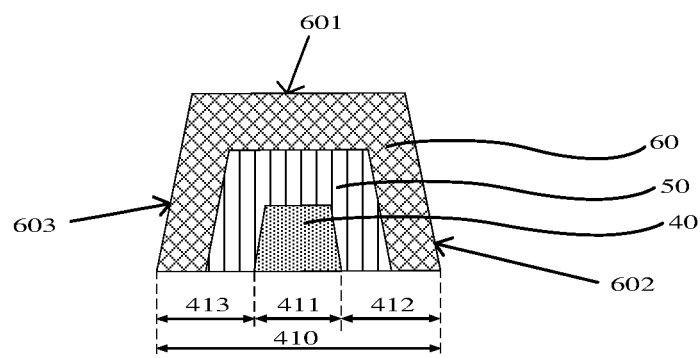
FIG. 4 is a cross-sectional view of a channel region of an array substrate provided by Embodiment 1 of the present application.

Referring to FIG. 4, FIG. 4 is a cross-sectional view of the channel region of the array substrate provided in Embodiment 1 of the present application.

In this embodiment, the gate insulating layer 50 has a groove structure, and an opening of the groove structure faces the active layer 40; the gate insulating layer 50 covers opposite side surfaces and an upper surface of the active layer 40 corresponding to the channel region 410.

In this embodiment, the gate 60 has a groove structure; and an opening of the groove structure faces the active layer 40; a region of the groove structure corresponding to the active layer 40 is the channel region 410; the gate 60 covers opposite side surfaces and an upper surface of the gate insulating layer 50; a part of the active layer 40 corresponding to the channel region 410 is insulated from and disposed in the groove structure of the gate 60.

In this embodiment, the channel region 410 of the active layer 40 includes a first channel region 411 on an upper surface of the active layer 40, and a second channel region 412 and the third channel region 413 on opposite side surfaces of the active layer 40, respectively. The second channel 412, the first channel region 411, and the third channel region 413 are continuous.

In this embodiment, by designing the channel region 410 as a continuous region composed of the second channel region 412, the first channel region 411, and the third channel region 413, the width of the channel region 410 is increased in disguised form, which is conducive to increase the size of the drive current.

The gate 60 includes a top portion 601 corresponding to the first channel region 411, a first side portion 602 corresponding to the second channel region 412, and a second side portion 603 corresponding to the third channel region 413. The top 601, the first side portion 602, and the second side portion 603 of the gate 60 together constitute the groove structure.

An extending direction of the groove structure of the gate 60 is a first direction, and a second direction is perpendicular to the extending direction of the groove structure of the gate 60. The gate 60, the gate insulating layer 50 and the active layer 40 constitutes a three-dimensional channel structure, and a channel width of the three-dimensional channel structure is a sum of side lengths of cross sections of the top portion 601, the first side portion 602, and the second side portion 603 of the gate 60 in the second direction.

It should be noted that in this embodiment, the width of the three-dimensional channel structure is not greater than 6 um, which is not particularly limited herein.

In this embodiment, a cross-sectional shape of the three-dimensional channel structure perpendicular to the extending direction of the groove structure of the gate includes, but is not limited to, a trapezoid, a square, and/or a fin shape.

In this embodiment, the source 81 and the drain 82 are arranged at opposite ends of the active layer 40.

The source 81 covers opposite side surfaces and an upper surface of the source contact region 420; the drain 82 covers opposite side surfaces and an upper surface of the drain contact region 430.

In this embodiment, the electrode layer 100 is electrically connected to the source 81 through a via hole in the passivation layer 90.

In this embodiment, the buffer layer 30, the gate insulating layer 50, and the interlayer dielectric layer 70 all have strong barrier capabilities and insulating capabilities for water and oxygen, and each independently made of a material including but not particularly limited to one or a laminate of silicon oxide, nitride Silicon, silicon oxynitride, etc.

In this embodiment, the materials of the gate 60, the source 81, and the drain 82 include, but are not particularly limited to, metals or laminates selected from copper, silver, aluminum, etc.

Figure 5:
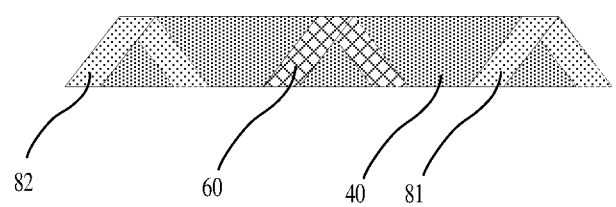
FIG. 5 is a perspective view of a channel region of an array substrate provided by Embodiment 1 of the present application.

Referring to FIG. 4 and FIG. 5, in this embodiment, the gate 60, the gate insulating layer 50, and the active layer 40 corresponding to the channel region 410 constitute a three-dimensional channel structure 410, which can increase the width of the channel region 410 in disguised form such that a large enough driving current is ensured while achieving a high switching current ratio and a high aperture ratio under a design of the same channel length, thereby solving the problem of excessive leakage current caused by reducing the channel width/length ratio and the process problem of small channels.

Referring to FIG. 6, FIG. 6 is a flow chart of a method of manufacturing an array substrate provided in Embodiment 1 of the present application.

In this embodiment, the method of manufacturing the array substrate includes the steps as follows.

Figure 7A:
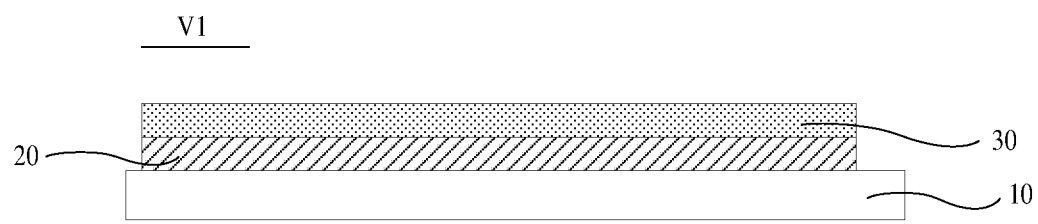
Figure 7B:
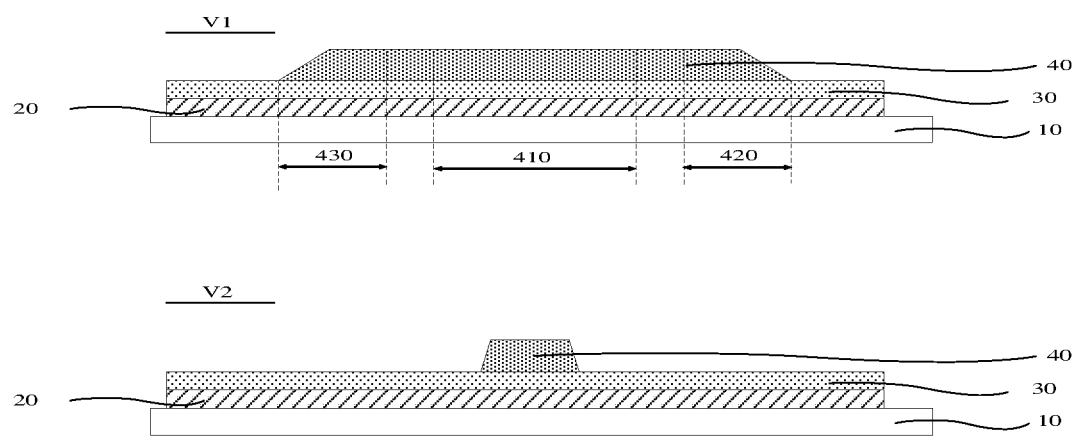

As shown in FIG. 7B, step S10: forming an active layer 40 on the buffer layer 30. The active layer 40 includes a channel region 410, a source contact region 420, and a drain contact region 430. The source contact region 420 and the drain contact region 430 are spaced apart from each other by the channel region 410.

a method of forming the active layer 40 includes but is not limited to etching; a material of the active layer 40 includes but is not limited to indium gallium zinc oxide, indium tin oxide, indium zinc oxide, and/or aluminum zinc oxide.

As shown in FIG. 7A, before the step S10, a substrate 10 is provided, and a light-shielding layer 20 and a buffer layer 30 are formed on the substrate 10.

The substrate 10 is a PI substrate, mainly made of polyimide, which can effectively improve the light transmittance. A material of the light-shielding layer 20 includes but is not limited to a metal or a metal laminate such as molybdenum, molybdenum-titanium alloy, silver, aluminum, etc.

As shown in FIG. 7C, step S20: forming a gate insulating layer 50 on the active layer 40.

The gate insulating layer 50 has a groove structure, and the gate insulating layer 50 covers the opposite side surfaces and the upper surface of the active layer 40 corresponding to the channel region 410.

As shown in FIG. 7D, step S30: forming a metal layer on the gate insulating layer 50, and patterning the metal layer to form a gate 60 on the channel region 410.

The gate 60 has a groove structure, and the gate 60 covers the opposite side surfaces and the upper surface of the gate insulating layer 50; a part of the active layer 40 corresponding to the channel region 410 is insulated from and disposed in the groove structure of the gate 60.

In this embodiment, the channel region 410 of the active layer 40 includes a first channel region 411 on an upper surface of the active layer 40, and a second channel region 412 and the third channel region 413 on opposite side surfaces of the active layer 40, respectively. The second channel 412, the first channel region 411, and the third channel region 413 are continuous.

The gate 60 includes a top portion 601 corresponding to the first channel region 411, a first side portion 602 corresponding to the second channel region 412, and a second side portion 603 corresponding to the third channel region 413. The top 601, the first side portion 602, and the second side portion 603 of the gate 60 together constitute the groove structure.

An extending direction of the groove structure of the gate 60 is a first direction, and a second direction is perpendicular to the extending direction of the groove structure of the gate 60. The gate 60, the gate insulating layer 50 and the active layer 40 constitutes a three-dimensional channel structure, and a channel width of the three-dimensional channel structure is a sum of side lengths of cross sections of the top portion 601, the first side portion 602, and the second side portion 603 of the gate 60 in the second direction.

In this embodiment, the width of the three-dimensional channel structure is not greater than 6 um, which is not particularly limited in this embodiment.

In this embodiment, the cross-sectional shape of the three-dimensional channel structure perpendicular to the extending direction of the groove structure of the gate 60 includes, but is not limited to, a trapezoid, a square, and a fin shape.

Figure 7E:
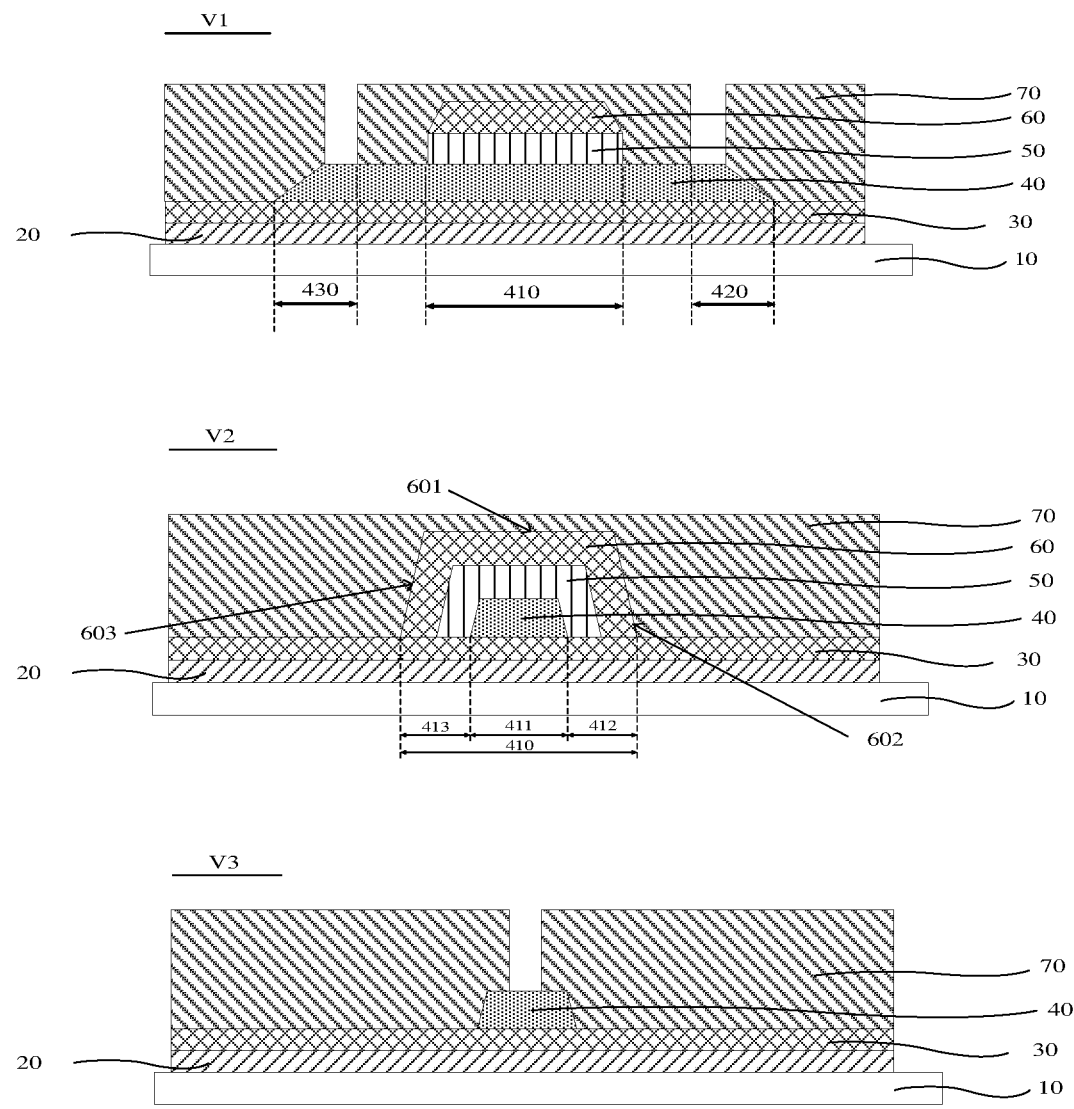

As shown in FIG. 7E, step S40: forming an interlayer insulating layer 70 on the gate 60, and patterning the interlayer insulating layer 70 to form a via hole located in the source contact region 420, and another via hole located in the drain contact region 430.

Figure 7F:
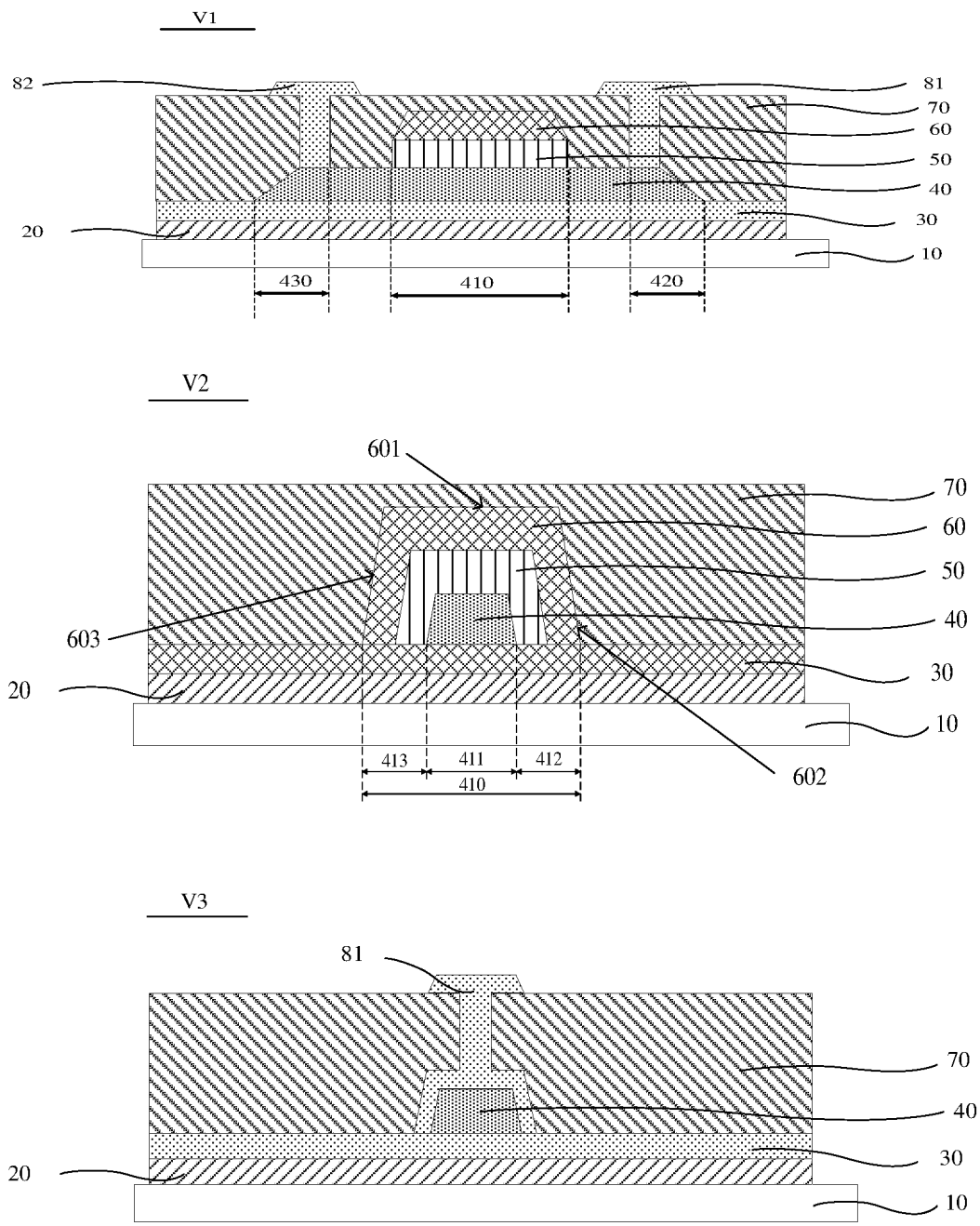

As shown in FIG. 7F, step S50: forming a source 81 in contact with the source contact region 420 and a drain 82 in contact with the drain contact region 430 on the interlayer insulating layer 70, The source 81 covers the opposite side surfaces and the upper surface of the source contact area 420, and the drain 82 covers the opposite side surfaces and the upper surface of the drain contact area 430.

In this embodiment, the source 81 and the drain 82 are disposed above the active layer 40 and cover two opposite edge regions of the active layer 40.

Figure 7G:
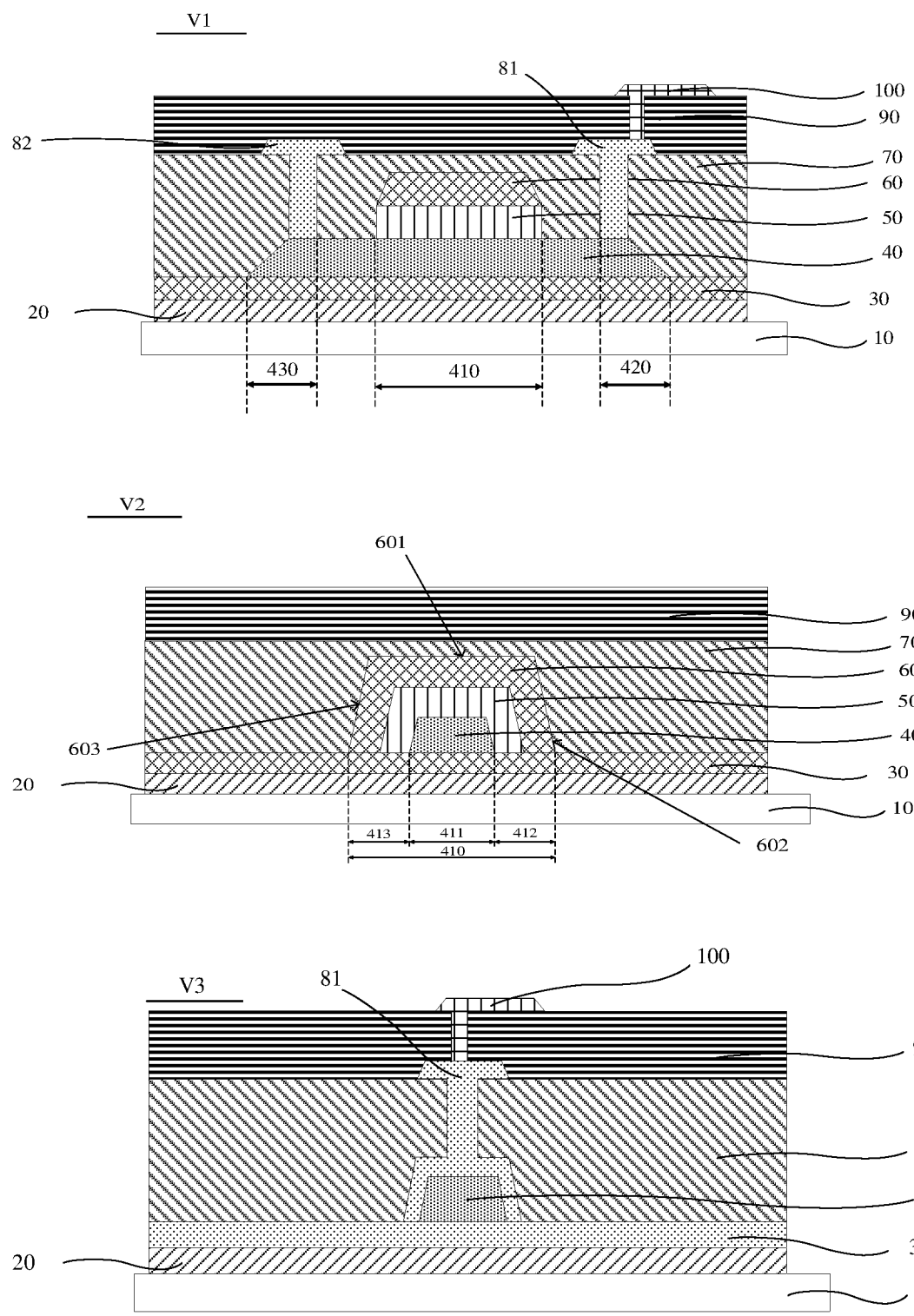

As shown in FIG. 7G, step S60: forming a passivation layer 90 and an electrode layer 100 on the source 81 and the drain 82 in sequence.

In this embodiment, the electrode layer 100 is electrically connected to the source 81 through a via hole in the passivation layer 90.

In this embodiment, the buffer layer 30, the gate insulating layer 50, and the interlayer dielectric layer 70 all have strong barrier capabilities and insulating capabilities for water and oxygen, and each independently made of a material including but not particularly limited to one or a laminate of silicon oxide, nitride Silicon, silicon oxynitride, etc.

In this embodiment, the materials of the gate 60, the source 81, and the drain 82 include, but are not particularly limited to, metals or laminates selected from copper, silver, aluminum, etc.

In this embodiment, the gate 60, the gate insulating layer 50, and the active layer 40 corresponding to the channel region 410 form a three-dimensional channel structure, which can increase the width of the channel region 410 in disguised form such that a large enough driving current is ensured while achieving a high switching current ratio and a high aperture ratio under a design of the same channel length, thereby solving the problem of excessive leakage current caused by reducing the channel width/length ratio and the process problem of small channels.

It should be noted that in FIG. 7A to FIG. 7G, the view V1 is a cross-sectional view along the direction A-A in FIG. 1, the view V2 is a cross-sectional view along the direction B-B in FIG. 1, and the view V3 is a cross-sectional view along the direction C-C in FIG. 1.

Embodiment 2

Figure 8:
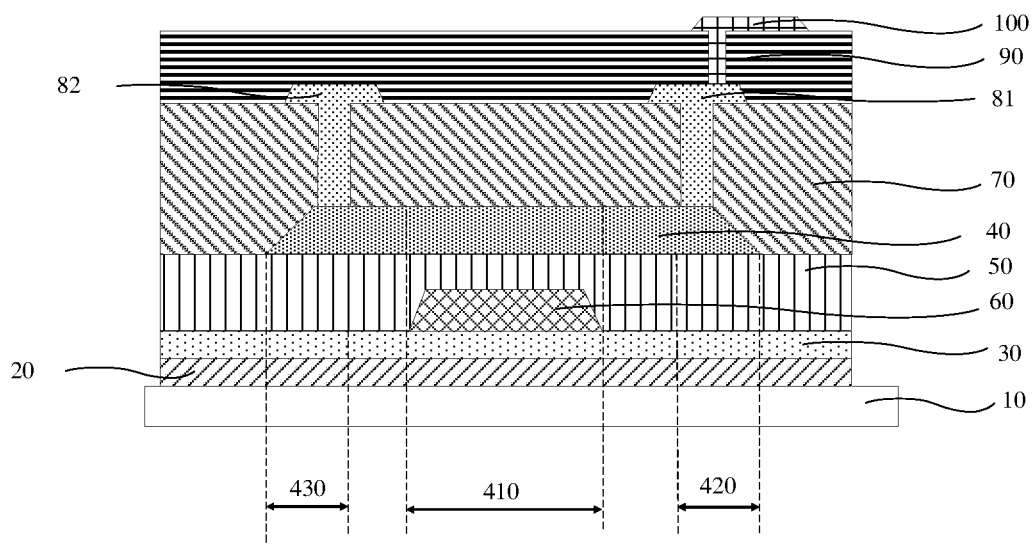
FIG. 8 is a cross-sectional view of an array substrate provided in Embodiment 2 of the present application

Referring to FIG. 8, a cross-sectional view of the array substrate provided in Embodiment 2 of the present application.

In this embodiment, the structure of the array substrate is similar/same as the structure of the array substrate provided in the above embodiment. Details can be referred to the description of the array substrate in the above Embodiment 1, and will not be repeated herein for brevity. The only difference therebetween is as follows:

In this embodiment, the array substrate is a bottom-gate array substrate.

In this embodiment, the array substrate includes a substrate 10, a light-shielding layer 20 disposed above the substrate 10, a buffer layer 30 disposed above the light-shielding layer 20, a gate 60 disposed above the buffer layer 30, a gate insulating layer 50 disposed above the gate 60, an active layer 40 disposed above the gate insulating layer 50, an interlayer dielectric layer 70 disposed above the active layer 40, a source 81 and a drain 82 disposed above the interlayer dielectric layer 70, a passivation layer 90 disposed above the source 81 and the drain 82, and an electrode layer 100 disposed above the passivation layer 90.

Figure 9:
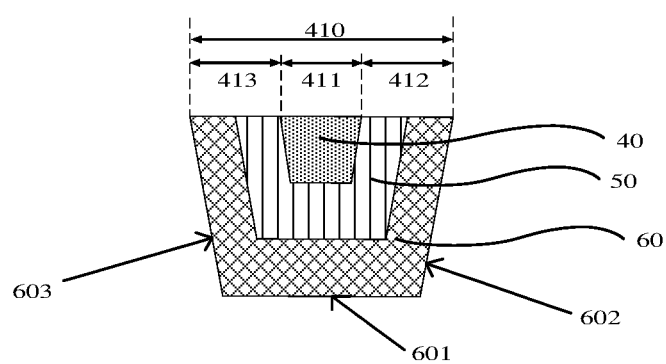
FIG. 9 is a cross-sectional view of a channel region of an array substrate provided in Embodiment 2 of the present application.

Referring to FIG. 9, FIG. 9 is a cross-sectional view of a channel region of the array substrate provided by Embodiment 2 of the present application.

In this embodiment, the gate insulating layer 50 has a groove structure, and the opening of the groove structure faces the active layer 40. The gate insulating layer 50 covers the opposite side surfaces and the bottom surface of the active layer 40 corresponding to the channel region 410.

In this embodiment, the gate 60 has a groove structure, and the groove structure has an opening facing the active layer 40, and a region of the groove structure corresponding to the active layer 40 is the channel region 410. The gate 60 covers the opposite side surfaces and the lower surface of the gate insulating layer 50; and a part of the active layer 40 corresponding to the channel region 410 is insulated from and disposed in the groove structure of the gate 60.

In this embodiment, the channel region 410 of the active layer 40 includes a first channel region 411 on an upper surface of the active layer 40, and a second channel region 412 and the third channel region 413 on opposite side surfaces of the active layer 40, respectively. The second channel 412, the first channel region 411, and the third channel region 413 are continuous.

In this embodiment, by designing the channel region 410 as a continuous region composed of the second channel region 412, the first channel region 411, and the third channel region 413, the width of the channel region 410 is increased in disguised form, which is conducive to increase the size of the drive current.

The gate 60 includes a top portion 601 corresponding to the first channel region 411, a first side portion 602 corresponding to the second channel region 412, and a second side portion 603 corresponding to the third channel region 413. The top 601, the first side portion 602, and the second side portion 603 of the gate 60 together constitute the groove structure.

An extending direction of the groove structure of the gate 60 is a first direction, and a second direction is perpendicular to the extending direction of the groove structure of the gate 60. The gate 60, the gate insulating layer 50 and the active layer 40 constitutes a three-dimensional channel structure, and a channel width of the three-dimensional channel structure is a sum of side lengths of cross sections of the top portion 601, the first side portion 602, and the second side portion 603 of the gate 60 in the second direction.

In this embodiment, the width of the three-dimensional channel structure is not greater than 6 um, which is not particularly limited in this embodiment.

Figure 10:
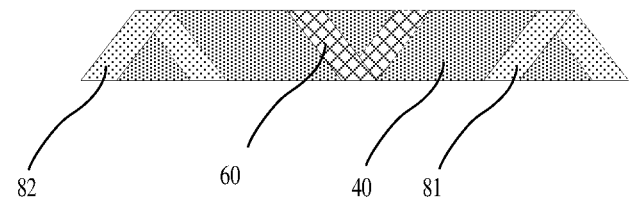
FIG. 10 is a perspective view of a channel region of an array substrate provided by Embodiment 2 of the present application.

Referring to FIG. 9 and FIG. 10, in this embodiment, the active layer 40, the gate insulating layer 50, and the gate 60 corresponding to the channel region 410 form a three-dimensional channel structure, which can increase the width of the channel region 410 in disguised form such that a large enough driving current is ensured while achieving a high switching current ratio and a high aperture ratio under a design of the same channel length, thereby solving the problem of excessive leakage current caused by reducing the channel width/length ratio and the process problem of small channels.

Embodiment 3

Figure 11:
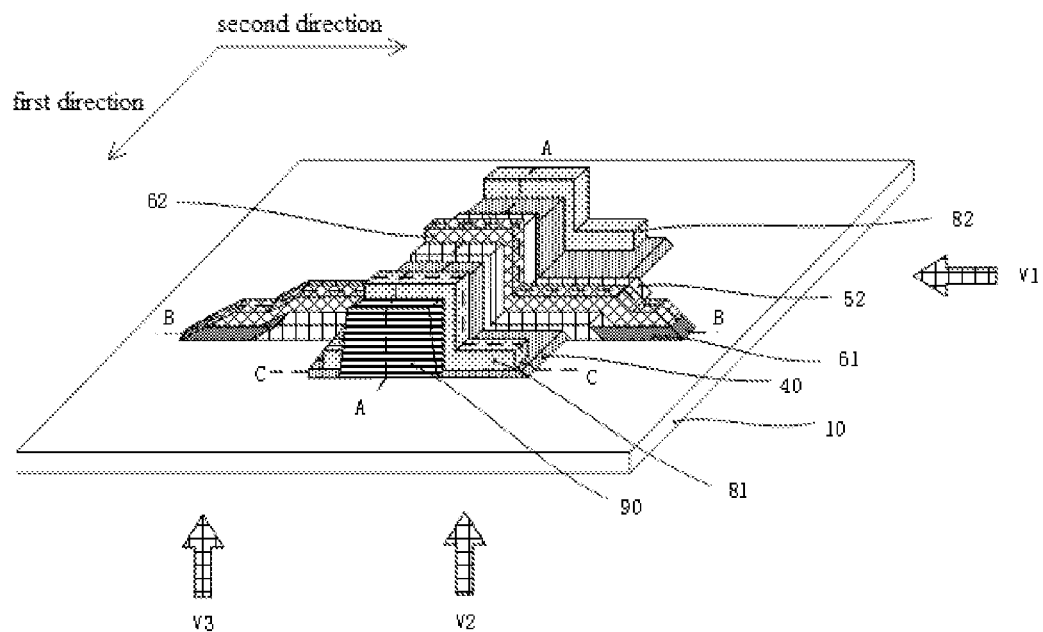
FIG. 11 is a three-dimensional view of an array substrate provided by Embodiment 3 of the present application.
Figure 12:
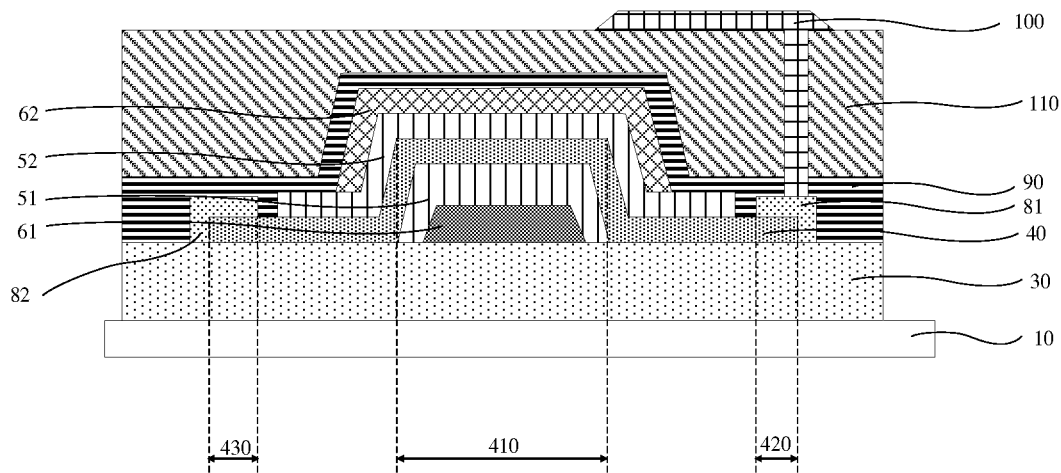
FIG. 12 is a cross-sectional view of the array substrate provided by Embodiment 3 of the present application.

Referring to FIG. 11 and FIG. 12, in this embodiment, the array substrate includes a substrate 10, a buffer layer 30 disposed above the substrate 10, a first gate 61 disposed above the buffer layer 30, a first gate insulating layer 51 disposed above the first gate 61, an active layer 40 disposed above the first gate insulating layer 51, a second gate insulating layer 52 disposed above the active layer 40, and a second gate 62 disposed above the second gate insulating layer 52.

The array substrate further includes a source 81 and a drain 82 disposed above the active layer 40 and covering two opposite edge regions of the active layer 40, passivation layer 90 disposed above the source 81, the drain 82, and the second gate insulating layer 62, a planarization layer 110 disposed above the passivation layer 90, and an electrode layer 100 disposed above the planarization layer 110.

In this embodiment, the substrate 10 is a PI substrate, mainly made of polyimide, which can effectively improve the light transmittance.

In this embodiment, the active layer 40 includes a channel region 410, a source contact region 420 in contact with the source 81, and a drain contact region 430 in contact with the drain 82; and the source contact region 420 and the drain contact region 430 are spaced apart from each other by the channel region 410, wherein the source 81 covers opposite side surfaces and an upper surface of the source contact region 420, and the drain 82 covers opposite side surfaces and an upper surface of the drain contact area 430.

A material of the active layer 40 includes, but is not limited to, indium gallium zinc oxide, indium tin oxide, indium zinc oxide, and/or aluminum zinc oxide.

It should be noted that the film structure included in the above-mentioned array substrate is only used as an example, which is not particularly limited in the present application.

In this embodiment, the buffer layer 30 is arranged corresponding to the channel region 410 of the active layer 40; a shape of the buffer layer 30 includes but is not limited to a rectangle; and a height of the buffer layer 30 is not particularly limited in this embodiment.

Figure 13:
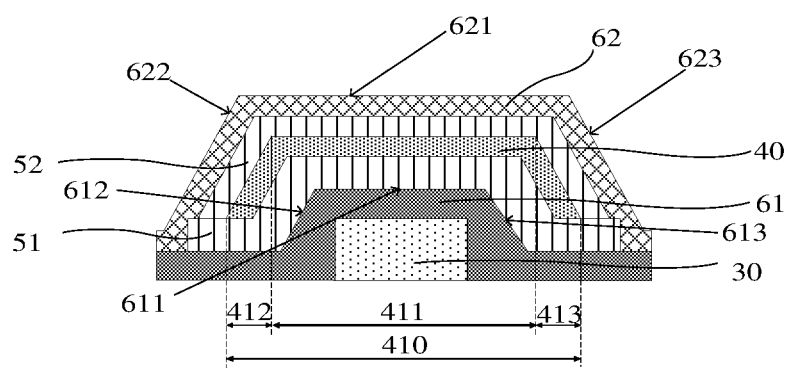
FIG. 13 is a cross-sectional view of the channel region of the array substrate provided by the Embodiment FIG. 3 of the present application.

Referring to FIG. 13, FIG. 13 is a cross-sectional view of a channel region of an array substrate provided in Embodiment 3 of the present application.

In this embodiment, the first gate 61 is a bottom gate electrode, the first gate 61 has a groove structure covering opposite side surfaces and an upper surface of the buffer layer 30, the first gate insulating layer 51 has a groove structure covering opposite side surfaces and an upper surface of the first gate 61, and the active layer 40 has a groove structure covering opposite side surfaces and an upper surface of the first gate insulating layer 51, wherein a part of first gate 61 corresponding to the channel region 410 of the active layer 40 is insulated from and disposed in the groove structure of the active layer 40.

Referring to FIG. 11 and FIG. 12, in this embodiment, an extending direction of the groove structure of the first gate 61 is a first direction, and a second direction is perpendicular to the extending direction of the groove structure of the first gate 61. Along the first direction, a projection of the first gate insulating layer 51 on the substrate 10 covers a projection of the first gate 61 on the substrate 10. Along the second direction, the first gate insulating layer 51 covers the first gate 61, so as to prevent the first gate 61 from in contact with the active layer 40.

In this embodiment, the second gate insulating layer 52 has a groove structure covering opposite side surfaces and an upper surface of the active layer 40.

The second gate 62 is a top gate electrode, and the second gate 62 covers opposite side surfaces and the upper surface of the second gate insulating layer 52; wherein a part of the active layer 40 corresponding to the channel region 410 is insulated from and disposed in the groove structure of the second gate 62.

In this embodiment, a shape of the second gate 62 along the channel region 410 includes but is not limited to a trapezoid.

Further, in this embodiment, the second gate 62 along the channel region 410 has a trapezoidal shape; the second gate 62 covers opposite side surfaces of the channel region 410, thereby preventing the channel region 410 from being impacted by side light to generate a large amount of photocurrent, which greatly increases the leakage current of the device.

Referring to FIG. 11 and FIG. 13, in this embodiment, along the second direction, a projection of the first gate insulating layer 51 on the substrate 10 falls within a projection of the first gate 61 on the substrate 10; and a projection of the active layer 40 on the substrate 10 falls within the projection of the first gate insulating layer 51 on the substrate 10. The first gate 61 and the active layer 40 are insulated from each other.

The second gate 62 and the first gate 61 are in contact with each other on the substrate 10, so that aside surface of the top gate electrode and a side surface of the bottom gate electrode are connected to each other, thereby realizing control of the channel region 410 of the active layer 40, thus reducing parasitic capacitance between the metal layers in the array substrate.

In this embodiment, the channel region 410 of the active layer 40 includes a first channel region 411 on an upper surface of the active layer 40, and a second channel region 412 and the third channel region 413 on opposite side surfaces of the active layer 40, respectively. The second channel 412, the first channel region 411, and the third channel region 413 are continuous.

The first gate 61 includes a top portion 611 corresponding to the first channel region 411, a first side portion 612 corresponding to the second channel region 412, and a second side portion 613 corresponding to the third channel region 413. The top 611, the first side portion 612, and the second side portion 613 of the first gate 61 together constitute the groove structure.

The second gate 62 includes a top portion 622 corresponding to the first channel region 411, a third side portion 621 corresponding to the second channel region 412, and a fourth side portion corresponding to the third channel region 413. The top 621, the third side portion 622, and the fourth side portion 623 of the second gate 62 together constitute the groove structure.

In this embodiment, the buffer layer 30, the first gate 61, the first gate insulating layer 51, the active layer 40, the second gate insulating layer 52, the first gate insulating layer, and the second gate 62 constitute a three-dimensional channel structure; and a width of the three-dimensional channel structure is a sum of side lengths of cross sections of the top portion 611, the first side portion 612, and the second side portion 613 of the first gate 61 in the second direction and side lengths of cross sections of the top portion 621, the third side portion 622, and the fourth side portion 623 of the second gate 62 in the second direction.

Figure 14:
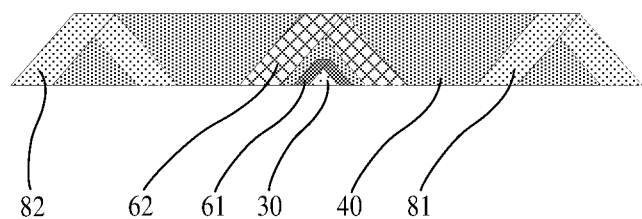
FIG. 14 is a perspective view of the channel region of the array substrate provided by Embodiment 3 of the present application.

Referring to FIG. 13 and FIG. 14, in this embodiment, the buffer layer 30, the first gate 61, the first gate insulating layer 51, the active layer 40, the second gate insulating layer 52, and the second gate 62 form a three-dimensional channel structure, which can increase the width of the channel region 410 in disguised form such that a large enough driving current is ensured while achieving a high switching current ratio and a high aperture ratio under a design of the same channel length, thereby solving the problem of excessive leakage current caused by reducing the channel width/length ratio and the process problem of small channels. Meanwhile, the second gate 62 covers the opposite side surfaces of the channel region 410, thereby preventing the channel region 410 from being impacted by light irradiation, which further improves the stability of the device.

Figure 15:
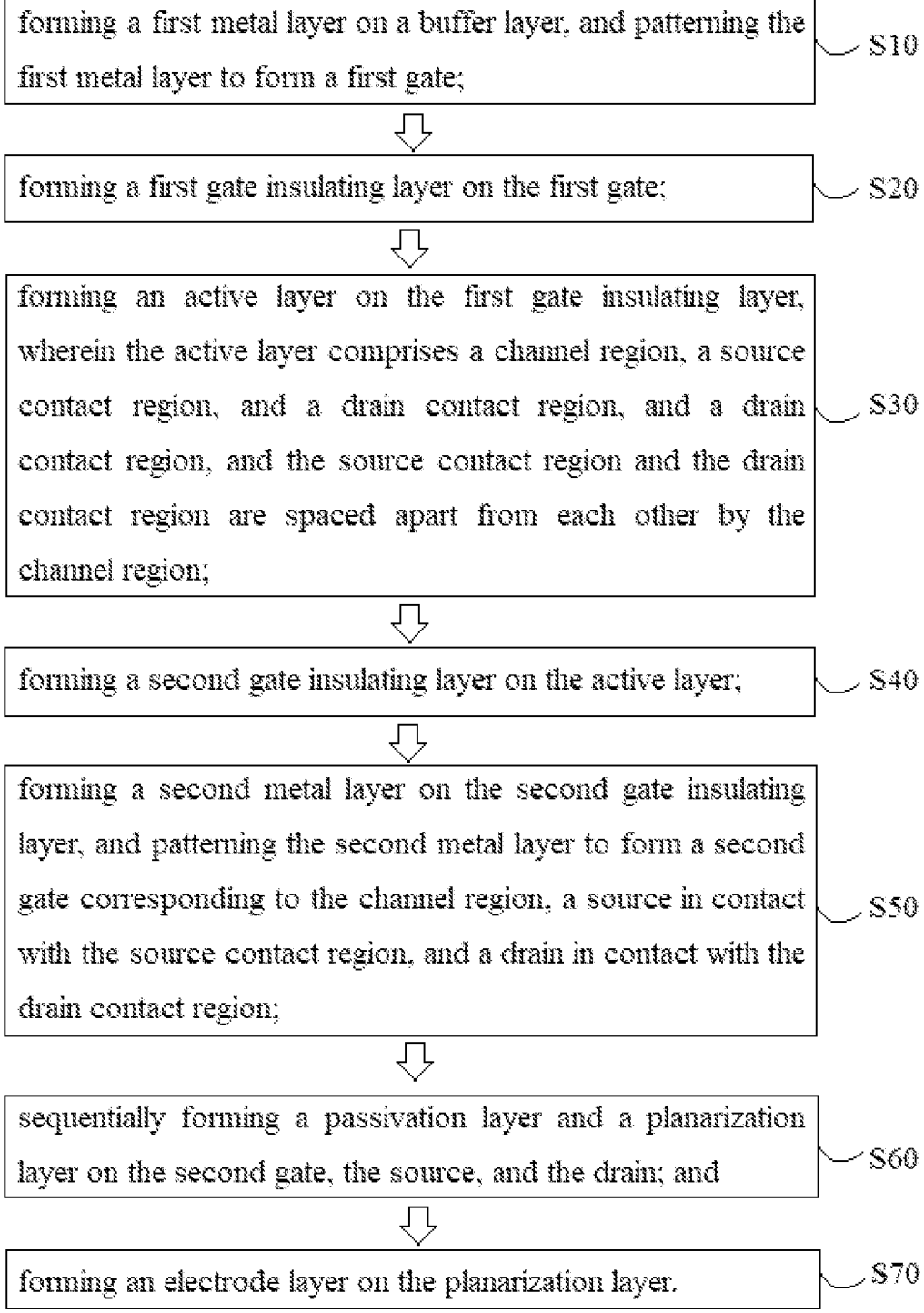
FIG. 15 is a flow chart of the steps of the method of manufacturing the array substrate provided by Embodiment 3 of the present application.

Referring to FIG. 15, FIG. 15 is a flow chart of the steps of the method of manufacturing the array substrate provided by Embodiment 3 of the present application.

In this embodiment, the method of manufacturing the array substrate includes the steps as follows.

As shown in FIG. 16B, step S10: forming a first metal layer on the buffer layer 30, and patterning the first metal layer to form a first gate 61.

In this embodiment, the first gate 61 has a groove structure, and the first gate 61 covers opposite side surfaces and an upper surface of the buffer layer 30. A material of the first gate 61 includes but is not limited to a metal of a laminate selected from copper, silver, aluminum etc.

As shown in FIG. 16A, before the step S10, a substrate 10 is provided, and a buffer layer 30 is formed on the substrate 10.

In this embodiment, the substrate 10 is a PI substrate, mainly made of polyimide, which can effectively improve the light transmittance.

The shape of the buffer layer 30 includes but is not limited to a rectangle; the buffer layer 30 has strong barrier capability and insulation capability for water and oxygen, and may be made of a material including, but not limited to one or a laminate of silicon oxide, silicon nitride, silicon oxynitride, etc.

Figure 16C:
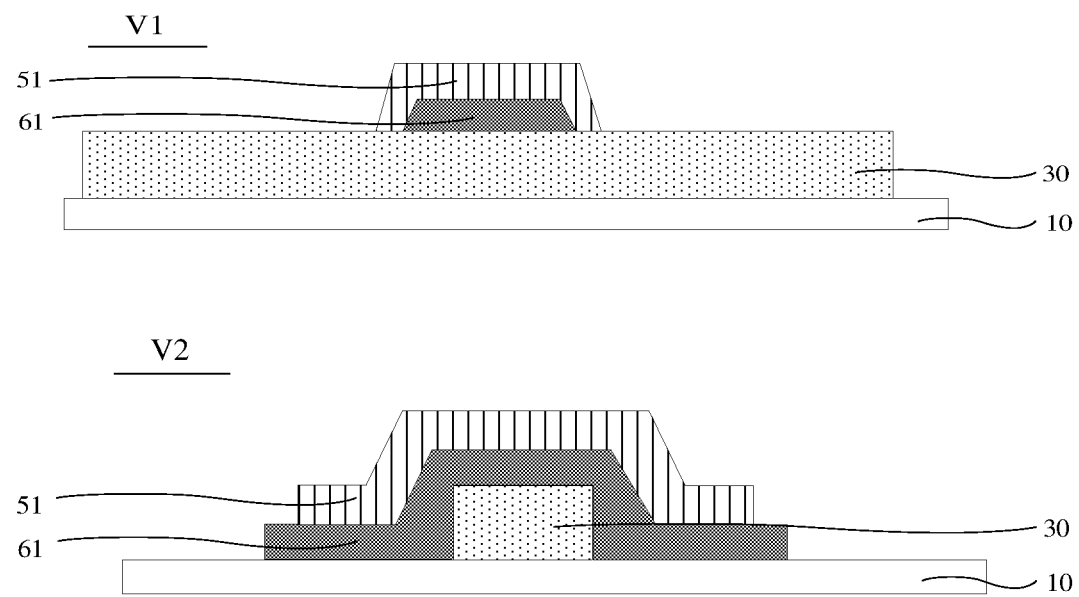

As shown in FIG. 16C, step S20: forming a first gate insulating layer 51 on the first gate 61.

The first gate insulating layer 51 has a groove structure, and the first gate insulating layer 51 covers opposite side surfaces and an upper surface of the first gate 61. The first gate insulating layer 51 has a strong barrier capacity and insulation capacity for water and oxygen, and may be made of a material including, but not limited to one or a laminate of silicon oxide, silicon nitride, silicon oxynitride, etc.

Figure 16D:
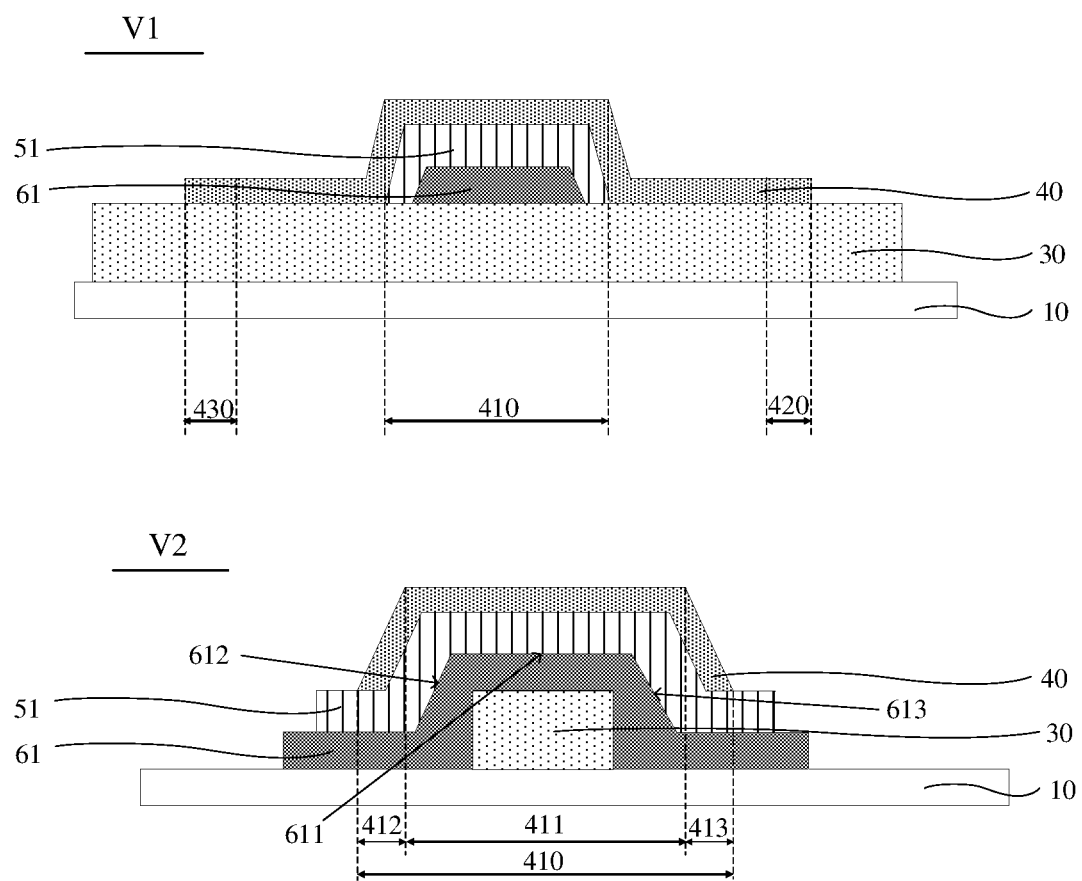

As shown in FIG. 16D, step S30: forming an active layer 40 on the first gate insulating layer 51, wherein the active layer 40 includes a channel region 410, a source contact region 420, and a drain contact region 430, and the source contact region 420 and the drain contact region 430 are spaced apart from each other by the channel region 410.

Referring to FIG. 11, in this embodiment, along the second direction, the projection of the first gate insulating layer 51 on the substrate 10 is disposed on the surface of the first gate 61 on the substrate 10. In the projection; the projection of the active layer 40 on the substrate 10 is disposed in the projection of the first gate insulating layer 51 on the substrate 10; the first gate 61 and the active layer 40 insulation setting.

In this embodiment, the buffer layer 30 is provided corresponding to the channel region 410 of the active layer 40.

The material of the active layer 40 includes one or more of indium gallium zinc oxide, indium tin oxide, indium zinc oxide, and aluminum zinc oxide, which is not particularly limited in this embodiment.

The active layer 40 has a groove structure, and the active layer 40 covers opposite side surfaces and the upper surface of the first gate insulating layer 51; the first gate 61 corresponds to the active layer 40 Part of the channel region 410 is insulated and disposed in the groove structure of the active layer 40.

In this embodiment, the channel region 410 of the active layer 40 includes a first channel region 411 on an upper surface of the active layer 40, and a second channel region 412 and the third channel region 413 on opposite side surfaces of the active layer 40, respectively. The second channel 412, the first channel region 411, and the third channel region 413 are continuous.

The first gate 61 includes a top portion 611 corresponding to the first channel region 411, a first side portion 612 corresponding to the second channel region 412, and a second side portion corresponding to the third channel region 413 613, the top 611, the first side portion 612, and the second side portion 613 of the first gate 61 together constitute the groove structure.

Figure 16E:
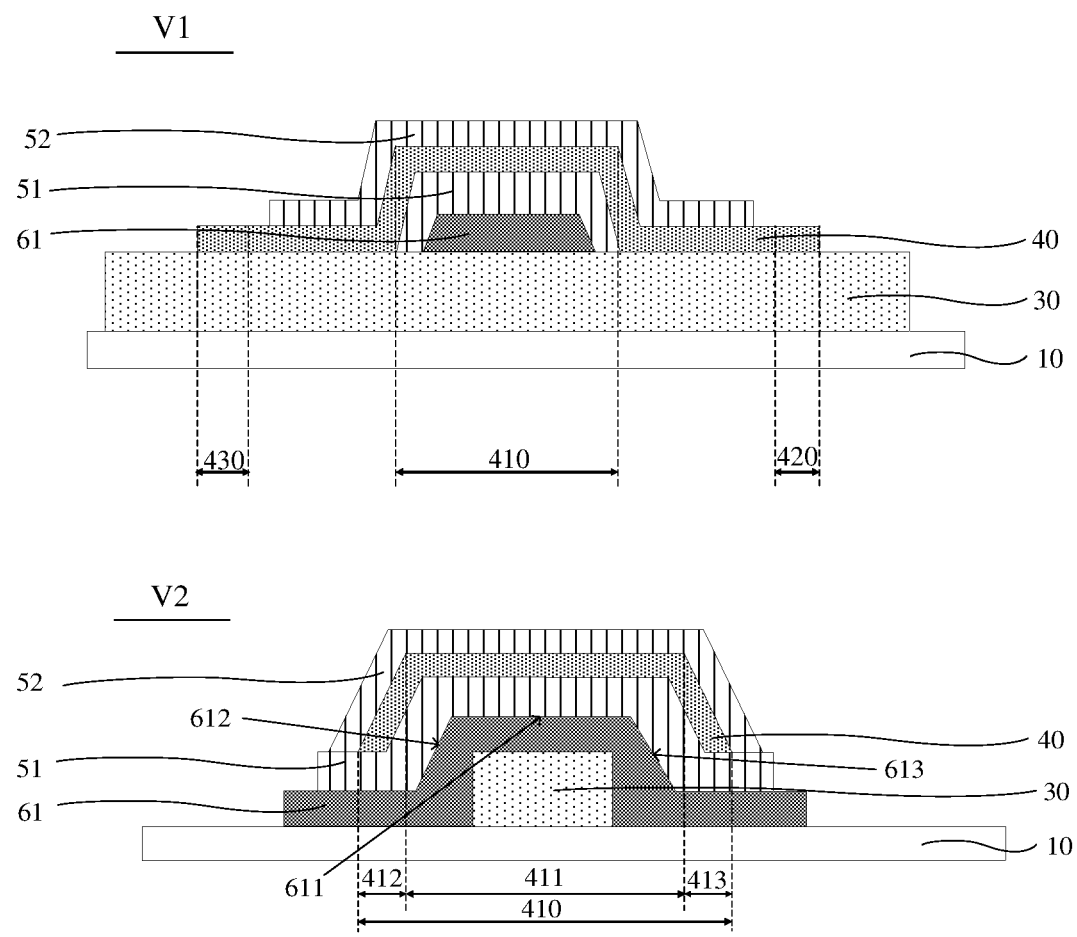

As shown in FIG. 16E, step S40: forming a second gate insulating layer 52 on the active layer 40.

The second gate insulating layer 52 has a groove structure, and second gate insulating layer 52 covers the opposite side surfaces and the upper surface of the active layer 40.

The second gate insulating layer 52 has a strong barrier capacity and insulation capacity for water and oxygen, and may be made of a material including, but not limited to one or a laminate of silicon oxide, silicon nitride, silicon oxynitride, etc.

As shown in FIG. 16F, step S50: forming a second metal layer on the second gate insulating layer 52, and patterning the second metal layer to form a second gate 62 corresponding to the channel region 410, a source 81 in contact with the source contact area 420, and a drain 82 in contact with the drain contact area 430.

In this embodiment, materials of the second gate 62, the source 81, and the drain 82 include, but are not particularly limited to, metals or laminates selected from copper, silver, aluminum, etc.

The second gate 62 has a groove structure, and the gate 60 covers opposite side surfaces and an upper surface of the second gate insulating layer 52; a part of the active layer 40 corresponding to the channel region 410 is insulated from and disposed in the groove structure of the second gate 62; and the second gate 62 covers the opposite side surfaces of the channel region 410, so as to prevent the channel region 410 from being impacted by side light to generate a large amount of photocurrent, which greatly increases the leakage current of the device.

The second gate 62 includes a top portion 622 corresponding to the first channel region 411, a third side portion 621 corresponding to the second channel region 412, and a fourth side portion corresponding to the third channel region 413. The top 621, the third side portion 622, and the fourth side portion 623 of the second gate 62 together constitute the groove structure.

Referring to FIG. 11, in this embodiment, the buffer layer 30, the first gate 61, the first gate insulating layer 51, the active layer 40, the second gate insulating layer 52, the first gate insulating layer, and the second gate 62 constitute a three-dimensional channel structure; and a width of the three-dimensional channel structure is a sum of side lengths of cross sections of the top portion 611, the first side portion 612, and the second side portion 613 of the first gate 61 in the second direction and side lengths of cross sections of the top portion 621, the third side portion 622, and the fourth side portion 623 of the second gate 62 in the second direction.

In this embodiment, a cross-sectional shape of the three-dimensional channel structure perpendicular to the extending direction of the groove structure of the first gate 61 includes, but is not limited to, a trapezoid, a square, and/or a fin shape.

In this embodiment, the source 81 is in contact with the source contact area 420, and the drain 82 is in contact with the drain contact area 430; wherein, the source 81 covers opposite side surfaces and an upper surface of the source contact area 420, and the drain 82 covers opposite side surfaces and an upper surface of the drain contact area 430.

As shown in FIG. 16G, step S60: forming a passivation layer 90 and a planarization layer 110 on the second gate 62, the source 81, and the drain 82 in sequence.

In this embodiment, the step S60 further includes patterning the passivation layer 90 and the planarization layer 110 to form a via hole that partially exposes the source 81.

As shown in FIG. 16H, step S70: forming an electrode layer 100 on the planarization layer 110.

The electrode layer 100 is electrically connected to the source 81 through the via hole in the passivation layer 90 and the planarization layer 110.

In this embodiment, the buffer layer 30, the first gate 61, the first gate insulating layer 51, the active layer 40, the second gate insulating layer 52, and the second gate 62 forms a three-dimensional channel structure, which can increase the width of the channel region 410 in disguised form such that a large enough driving current is ensured while achieving a high switching current ratio and a high aperture ratio under a design of the same channel length, thereby solving the problem of excessive leakage current caused by reducing the channel width/length ratio and the process problem of small channels.

It should be noted that in FIG. 16A to FIG. 16H, the view V1 is a cross-sectional view along the direction A-A of FIG. 11, the view V2 is a cross-sectional view along the direction B-B in FIG. 11, and the view V3 is a cross-sectional view along the direction C-C in FIG. 11.

In summary, the present application provides an array substrate and a manufacturing method thereof. The array substrate includes a substrate; an active layer comprising a channel region; a gate insulating layer; a gate corresponding to the channel region of the active layer; and a source and a drain disposed at opposite ends of the active layer, wherein the gate has a groove structure, the groove structure has an opening facing the active layer, and a region of the groove structure corresponding to the active layer is the channel region.

In the present application, the channel region corresponding to the gate, the gate insulating layer, and the active layer is formed into a three-dimensional channel structure, and the width of the channel region is increased in disguised form, such that a large enough driving current is ensured while achieving a high switching current ratio and a high aperture ratio under a design of the same channel length, thereby solving the problem of excessive leakage current caused by reducing the channel width/length ratio and the process problem of small channels.

It can be understood that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. An array substrate, comprising:
    a substrate;
    an active layer comprising a channel region;
    a gate insulating layer;
    a gate corresponding to the channel region of the active layer; and
    a source and a drain disposed at opposite ends of the active layer,
    wherein the gate has a groove structure, the groove structure has an opening facing the active layer, and a region of the groove structure corresponding to the active layer is the channel region,
    wherein the array substrate further comprises a buffer layer, the gate comprises a first gate and a second gate, and the gate insulating layer comprises a first gate insulating layer and a second gate insulating layer;
    wherein the substrate, the buffer layer, the first gate, the first gate insulating layer, the active layer, the second gate insulating layer, and the second gate are stacked in sequence; and
    wherein the buffer layer is disposed corresponding to the channel region of the active layer, the first gate has a groove structure covering opposite side surfaces and an upper surface of the buffer layer, the first gate insulating layer has a groove structure covering opposite side surfaces and an upper surface of the first gate, the active layer has a groove structure covering opposite side surfaces and an upper surface of the first gate insulating layer, the second gate insulating layer has a groove structure covering opposite side surfaces and an upper surface of the active layer, and the second gate covers opposite side surfaces and an upper surface of the second gate insulating layer.

2. The array substrate according to claim 1, wherein the active layer, the gate insulating layer, and the gate are stacked in sequence; the gate insulating layer has a groove structure covering opposite side surfaces and an upper surface of the active layer corresponding to the channel region; and the gate covers opposite side surfaces and an upper surface of the gate insulating layer.

3. The array substrate according to claim 2, wherein the channel region of the active layer comprises a first channel region defined on the upper surface of the active layer, and a second channel region and a third channel region defined on the opposite side surfaces of the active layer, respectively, and the second channel region, the first channel region, and the third channel region are continuous; and
    wherein the gate comprises a top portion corresponding to the first channel region, a first side portion corresponding to the second channel region, and a second side portion corresponding to the third channel region, and the top portion, the first side portion, and the second side portion of the gate together constitute the groove structure.

4. The array substrate according to claim 3, wherein the groove structure of the gate extends in a first direction, and a second direction is perpendicular to the first direction; and wherein the gate, the gate insulating layer, and the active layer constitute a three-dimensional channel structure, and a width of the three-dimensional channel structure is a sum of side lengths of cross sections of the top portion, the first side portion, and the second side portion of the gate in the second direction.

5. The array substrate according to claim 1, wherein the gate electrode, the gate insulating layer, and the active layer are stacked in sequence; the gate insulating layer has a groove structure, and the gate insulating layer covers opposite side surfaces and a lower surface of the active layer corresponding channel region, and the gate covers opposite side surfaces and a lower surface of the gate insulating layer.

6. The array substrate according to claim 5, wherein the channel region of the active layer comprises a first channel region defined on an upper surface of the active layer, a second channel region and a third channel region defined on opposite side surfaces of the active layer, respectively, and the second channel region, the first channel region, and the third channel region are continuous; and
    wherein the gate comprises a top portion corresponding to the first channel region, a first side portion corresponding to the second channel region, and a second side portion corresponding to the third channel region, and the top portion, the first side portion, and the second side portion of the gate portion together constitute the groove structure.

7. The array substrate according to claim 6, wherein the groove structure of the gate extends in a first direction, and a second direction is perpendicular to the first direction; and wherein the gate, the gate insulating layer, and the active layer constitute a three-dimensional channel structure, and a width of the three-dimensional channel structure is a sum of side lengths of cross sections of the top portion, the first side portion, and the second side portion of the gate in the second direction.

8. The array substrate according to claim 1, wherein the channel region of the active layer comprises a first channel region defined on the upper surface of the active layer, and a second channel region and a third channel region defined on opposite side surfaces of the active layer, respectively, and the second channel region, the first channel region, and the third channel region are continuous;
   wherein the first gate comprises a top portion corresponding to the first channel region, a first side portion corresponding to the second channel region, and a second side portion corresponding to the third channel region, and the top portion, the first side portion, and the second side portion of the first gate together constitute the groove structure; and
   wherein the second gate comprises a top portion corresponding to the first channel region, a third side portion corresponding to the second channel region, and a fourth side portion corresponding to the third channel region, and the top portion, the third side portion, and the fourth side portion of the second gate together constitute the groove structure.

9. The array substrate according to claim 8, wherein the groove structure of the first gate extends in a first direction, and a second direction is perpendicular to the first direction;
   wherein the buffer layer, the first gate, the first gate insulating layer, the active layer, the second gate insulating layer, and the second gate constitute a three-dimensional channel structure; and
   wherein a width of the three-dimensional channel structure is a sum of side lengths of cross sections of the top portion, the first side portion, and the second side portion of the first gate in the second direction and side lengths of cross sections of the top portion, the third side portion, and the fourth side portion of the second gate in the second direction.

10. A method of manufacturing an array substrate, comprising the following steps:
   step S10: forming a first metal layer on a buffer layer, and patterning the first metal layer to form a first gate;
   step S20: forming a first gate insulating layer on the first gate;
   step S30: forming an active layer on the first gate insulating layer, wherein the active layer comprises a channel region, a source contact region, and a drain contact region, and a drain contact region, and the source contact region and the drain contact region are spaced apart from each other by the channel region;
   step S40: forming a second gate insulating layer on the active layer;
   step S50: forming a second metal layer on the second gate insulating layer, and patterning the second metal layer to form a second gate corresponding to the channel region, a source in contact with the source contact region, and a drain in contact with the drain contact region;
   step S60: sequentially forming a passivation layer and a planarization layer on the second gate, the source, and the drain; and
   step S70: forming an electrode layer on the planarization layer.

11. The method of manufacturing the array substrate according to claim 10, wherein the buffer layer is disposed corresponding to the channel region of the active layer, the first gate has a groove structure covering opposite side surfaces and an upper surface of the buffer layer, the first gate insulating layer has a groove structure covering opposite side surfaces and an upper surface of the first gate, the active layer has a groove structure covering opposite side surfaces and an upper surface of the first gate insulating layer, the second gate insulating layer has a groove structure covering opposite side surfaces and an upper surface of the active layer, and the second gate covers opposite side surfaces and an upper surface of the second gate insulating layer.

12. The method of manufacturing the array substrate according to claim 11, wherein the channel region of the active layer comprises a first channel region defined on the upper surface of the active layer, and a second channel region and a third channel region defined on opposite side surfaces of the active layer, respectively, and the second channel region, the first channel region, and the third channel region are continuous;
   wherein the first gate comprises a top portion corresponding to the first channel region, a first side portion corresponding to the second channel region, and a second side portion corresponding to the third channel region, and the top portion, the first side portion, and the second side portion of the first gate together constitute the groove structure; and
   wherein the second gate comprises a top portion corresponding to the first channel region, a third side portion corresponding to the second channel region, and a fourth side portion corresponding to the third channel region, and the top portion, the third side portion, and the fourth side portion of the second gate together constitute the groove structure.

13. The method of manufacturing the array substrate according to claim 12, wherein the groove structure of the first gate is a first direction, and a second direction is perpendicular to the first direction;
   wherein the buffer layer, the first gate, the first gate insulating layer, the active layer, the second gate insulating layer, and the second gate constitute a three-dimensional channel structure; and
   wherein a width of the three-dimensional channel structure is a sum of side lengths of cross sections of the top portion, the first side portion, and the second side portion of the first gate in the second direction and side lengths of cross sections of the top portion, the third side portion, and the fourth side portion of the second gate in the second direction.

14. The method of manufacturing the array substrate according to claim 13, wherein a cross section of the three-dimensional channel structure perpendicular to an extending direction of the groove structure of the first gate has a trapezoid shape, a square shape, and/or a fin shape.

* * * * *